(12) United States Patent
Fiorini et al.

(10) Patent No.: US 7,723,606 B2
(45) Date of Patent: May 25, 2010

(54) METHOD OF MANUFACTURING A THERMOELECTRIC GENERATOR AND THERMOELECTRIC GENERATOR THUS OBTAINED

(75) Inventors: Paolo Fiorini, Brussels (BE); Vladimir Leonov, Leuven (BE); Sherif Sedky, Gize (EG); Chris Van Hoof, Leuven (BE); Kris Baert, Leuven (BE)

(73) Assignee: IMEC, Leuven (BE)

( * ) Notice: Subject to any disclaimer, the term of this patent is extended or adjusted under 35 U.S.C. 154(b) by 1239 days.

(21) Appl. No.: 11/174,185

(22) Filed: Jul. 1, 2005

(65) Prior Publication Data
US 2006/0000502 A1      Jan. 5, 2006

Related U.S. Application Data

(60) Provisional application No. 60/651,703, filed on Feb. 10, 2005.

(30) Foreign Application Priority Data
Jul. 1, 2004      (EP)      ................... 04447161

(51) Int. Cl.
*H01L 35/30*      (2006.01)
(52) U.S. Cl. .................. 136/205; 136/200; 136/202; 136/242; 368/203; 368/204
(58) Field of Classification Search .......... 136/205; 368/203, 204, 200, 202, 242
See application file for complete search history.

(56) References Cited

U.S. PATENT DOCUMENTS

| | | | |
|---|---|---|---|
| 3,790,829 A | 2/1974 | Roth | |
| 4,394,600 A * | 7/1983 | Flannagan | 313/500 |
| 4,995,023 A * | 2/1991 | Muller et al. | 368/276 |
| 5,022,989 A | 6/1991 | Put | |
| 5,052,644 A * | 10/1991 | Arieh et al. | 248/114 |
| 5,712,448 A | 1/1998 | Vandersande et al. | 136/203 |
| 6,046,398 A | 4/2000 | Foote et al. | |

(Continued)

FOREIGN PATENT DOCUMENTS

DE      3404137 A1      8/1985      ................ 35/12

(Continued)

OTHER PUBLICATIONS

Gao Min and D.M.Rowe, "Recent Concepts in Thermoelectric Power Generation", The 21st International Conference on Thermoelectronics, 2002, p. 365-374.*

(Continued)

*Primary Examiner*—Alexa D Neckel
*Assistant Examiner*—Xiuyu Tai
(74) *Attorney, Agent, or Firm*—McDonnell Boehnen Hulbert & Berghoff LLP

(57) ABSTRACT

A thermoelectric generator (TEG) and a method of fabricating the TEG are described. The TEG is designed so that parasitic thermal resistance of air and height of legs of thermocouples forming a thermopile can be varied and optimized independently. The TEG includes a micromachined thermopile sandwiched in between a hot and a cold plate and at least one spacer in between the thermopile and the hot and/or cold plate. The TEG fabrication includes fabricating the thermopiles, a rim, and the cold plate.

16 Claims, 24 Drawing Sheets

U.S. PATENT DOCUMENTS

| | | | |
|---|---|---|---|
| 6,075,199 | A | 6/2000 | Wong |
| 6,222,114 | B1 | 4/2001 | Mitamura |
| 6,291,760 | B1 * | 9/2001 | Mitamura ............... 136/205 |
| 6,407,965 | B1 * | 6/2002 | Matoge et al. ............ 368/204 |
| 6,426,921 | B1 * | 7/2002 | Mitamura ............... 368/204 |
| 6,438,964 | B1 | 8/2002 | Giblin |
| 6,819,226 | B2 | 11/2004 | Randall |
| 6,958,443 | B2 | 10/2005 | Stark et al. |
| 2002/0092557 | A1 | 7/2002 | Ghoshal ............... 136/201 |
| 2003/0097845 | A1 | 5/2003 | Saunders et al. |
| 2004/0113076 | A1 | 6/2004 | Guo et al. |
| 2006/0000502 | A1 | 1/2006 | Fiorini et al. |
| 2006/0048809 | A1 | 3/2006 | Onvural |
| 2006/0243317 | A1 | 11/2006 | Venkatasubramanian |
| 2008/0271772 | A1 | 11/2008 | Leonov |
| 2008/0314429 | A1 | 12/2008 | Leonov |

FOREIGN PATENT DOCUMENTS

| | | |
|---|---|---|
| EP | 1 001 470 A1 | 5/2000 |
| EP | 1 227 375 A1 | 7/2002 |
| EP | 1 612 870 A1 | 1/2006 |
| WO | WO2004/105143 | 12/2004 |
| WO | WO2005112141 | 11/2005 |

OTHER PUBLICATIONS

Kishi, M. et al., "Micro Thermoelectric Modules and their application to wristwatches as an energy source," IEEE, Eighteenth International Conference on Thermoelectrics, Proceedings ICT '99. Aug. 24, 1999, pp. 301-307.

Toriyama et al., "Thermoelectric Micro Power Generator Utilizing Self-Standing Polysilicon-Metal Thermopile," IEEE. Jan. 21, 2001, pp. 562-565.

Bottner et al., "New Thermoelectric Components Using Microsystem Technologies," Journal of Microelectromechanical Systems, vol. 13, No. 3, Jun. 2004, pp. 414-420.

Ryan et al., "Where There is Heat, There is a Way," The Electrochemical Society Interface, Jun. 2002, pp. 30-33.

Wang et al., "A New Type of Micro-thermoelectric Power Generator Fabricated by Nanowire Array Thermoelectric Material," $22^{nd}$ International Conference on Thermoelectrics, Aug. 17, 2003, pp. 682-684.

Stordeur et al., "Low Power Thermoelectric Generator—Self-Sufficient Energy Supply for Micro Systems," $16^{th}$ International Conference on Thermoelectrics, Aug. 26, 1997, pp. 575-577.

European Search Report dated Dec. 21, 2004.

Meyer et al., "Thin-Film Thermoelectric Generator Element Characterisation", IEEE 2005.

Bottner, H., "Thermoelectric Micro Devices: Current State, Recent Developments and Future Aspects for Technological Progress and Applications", 21st International Conference on Thermoelectronics, 2002, pp. 511-518.

Hasebe, S. et al., "Polymer Based Smart Flexible Thermopile for Power Generation", Micro Electro Mechanical Systems, 17th IEEE International Conference, Jan. 2004, pp. 689-692.

Jacquot, A. et al., "Fabrication and Modeling of an In-Plane Thermoelectric Micro-Generator", 21st International Conference on Thermoelectronics (2002), pp. 561-564.

Leonov, V. et al., "Thermoelectric MEMS Generators as a Power Supply for a Body Area Network", The 13th International Conference on Solid-State Sensors, Actuators and Microsystems, Seoul, Korea, Jun. 5-9, 2005, pp. 291-294.

Stark, Ingo et al., "New Micro Thermoelectric Devices Based on Bismuth Telluride-Type Thin Solid Films", 18th International Conference on Thermoelectrics, 1999, pp. 465-472.

Stark, Ingo, "Thermal Energy Harvesting With Thermo Life", Proceedings of the International Workshop on Wearable and Implantable Body Sensor Networks, 2006, 4 pages.

Strasser, M. et al., "Micromachined CMOS Thermoelectric Generators as On-Chip Power Supply", Transducers 2003, The 12th International Conference on Solid State Sensors, Actuators and Microsystems, Boston, Jun. 8-12, 2003, pp. 45-48.

Torfs, Tom et al., "Body-Heat Powered Autonomous Pulse Oximeter", IEEE Sensors 2006, EXCO, Daegu, Korea, Oct. 22-25, 2006, pp. 427-430.

Bottner, H. et al., "New Thermoelectric Components Using Micro-Systems-Technologies", ETS 2001—6th European Workshop on Thermoelectrics, 2001.

Gyselinckx et al., "Human++: Autonomous Wireless Sensors for Body Area Networks," Proc. of the Custom Integrated Circuit Conference (CICC'05) pp. 13-19 (2005).

Leonov et al., "Wireless microsystems powered by homeotherms," Proc. Smart Systems Integration Conference, Paris, 10 pages (Mar. 2007).

European Search Report, European Patent Application No.07447010.5 dated Sep. 7, 2007.

* cited by examiner

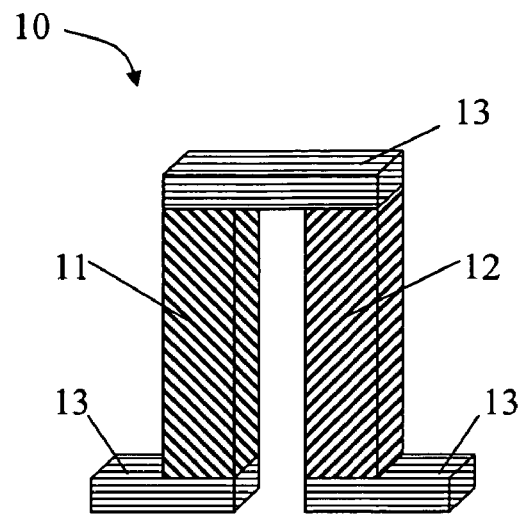
Fig. 1 – PRIOR ART
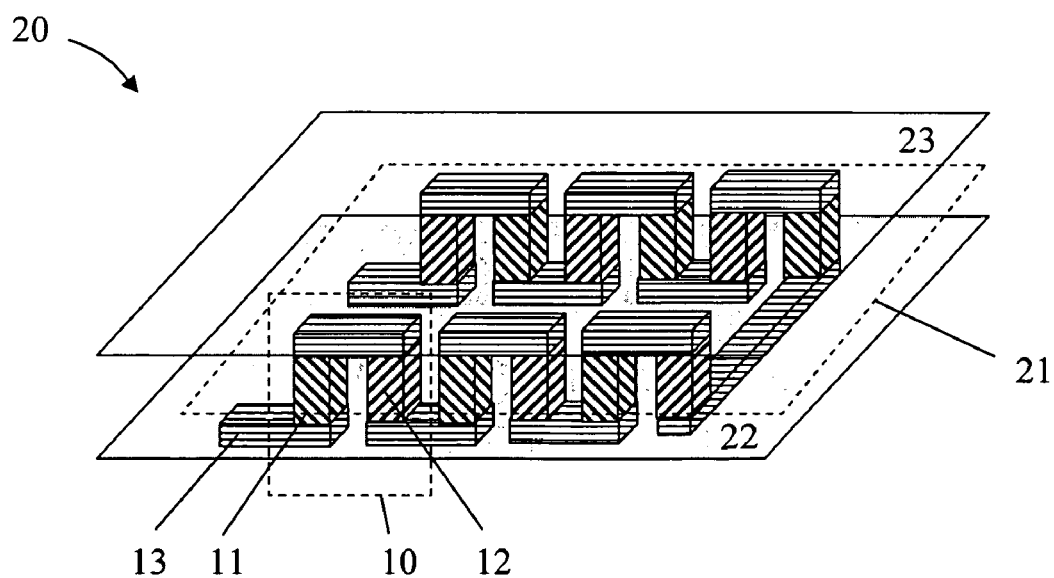
Fig. 2 – PRIOR ART

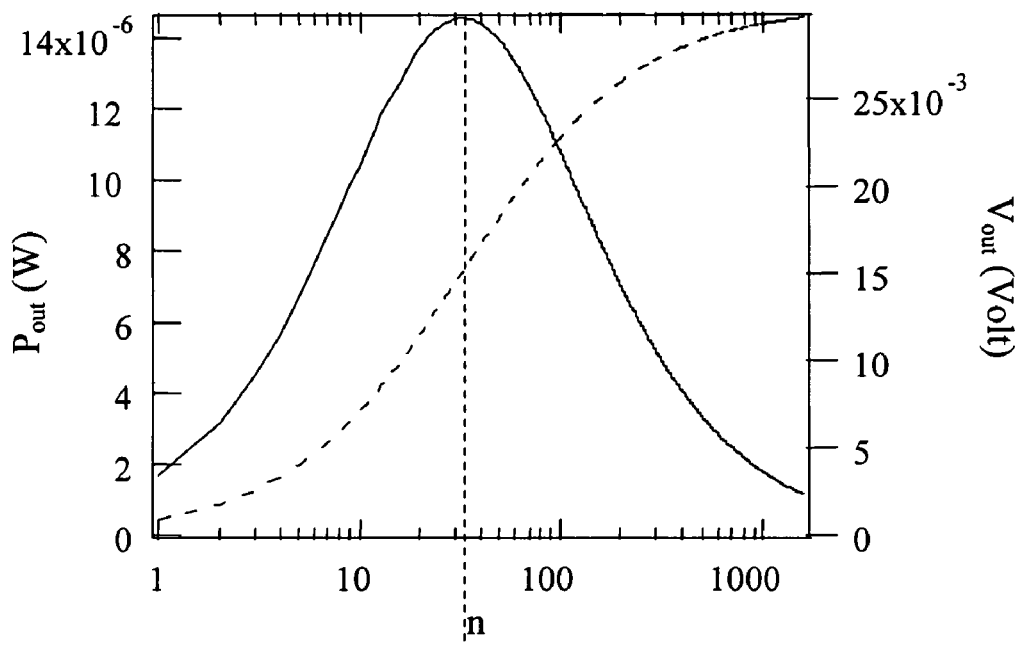
Fig. 3 – PRIOR ART
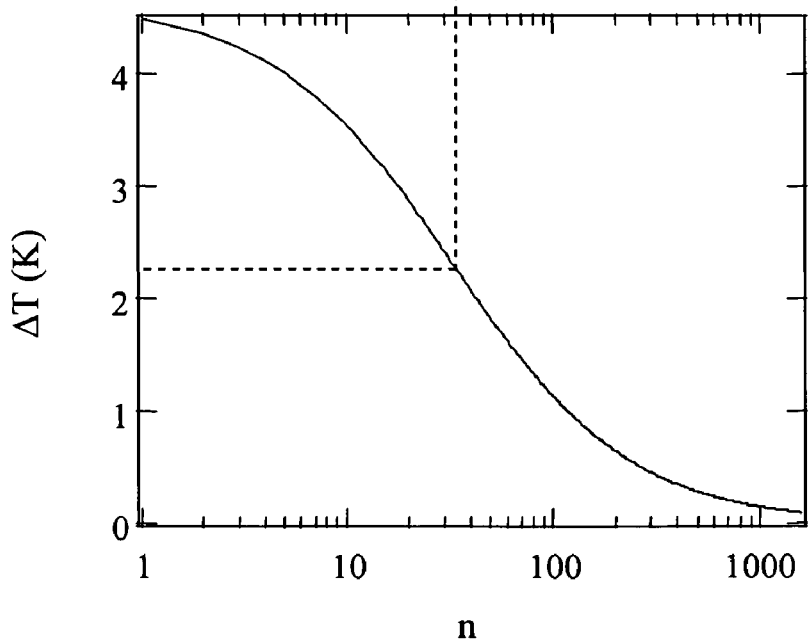
Fig. 4 – PRIOR ART

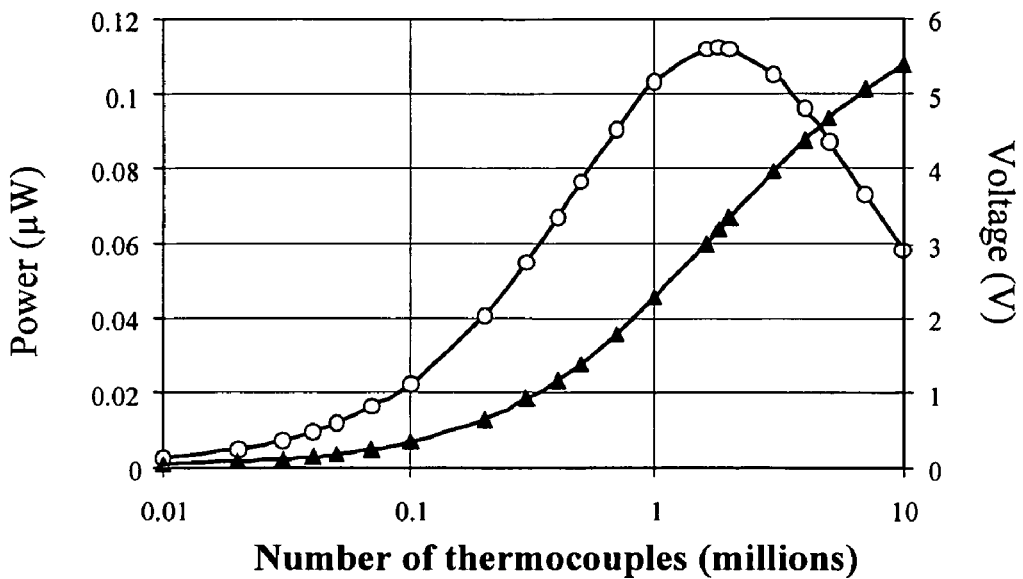
Fig. 5 – PRIOR ART
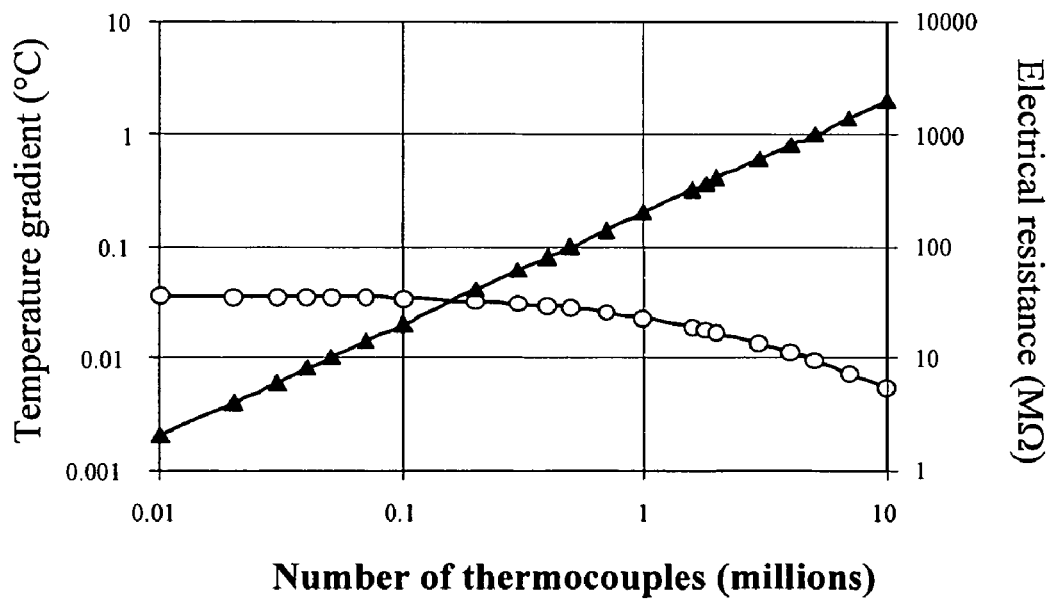
Fig. 6 – PRIOR ART

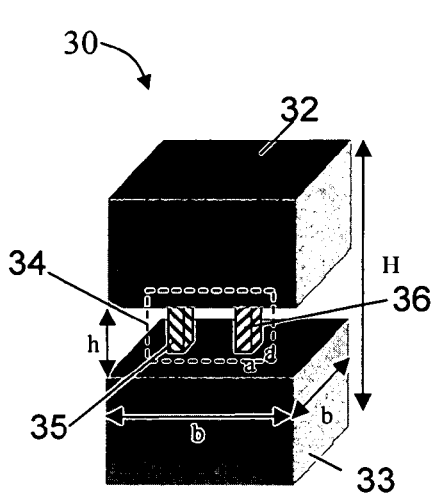
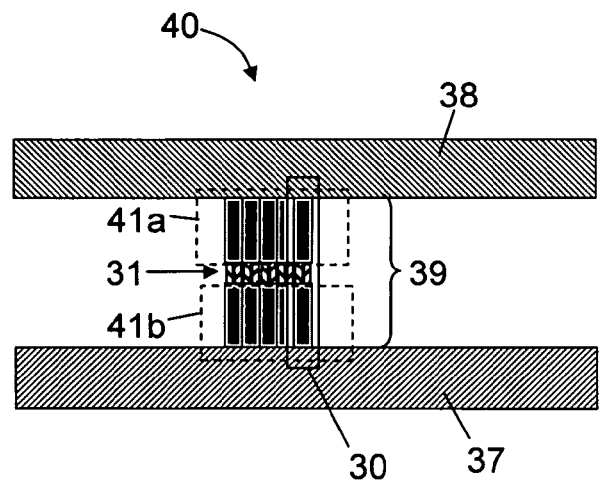
Fig. 7a  Fig. 7b
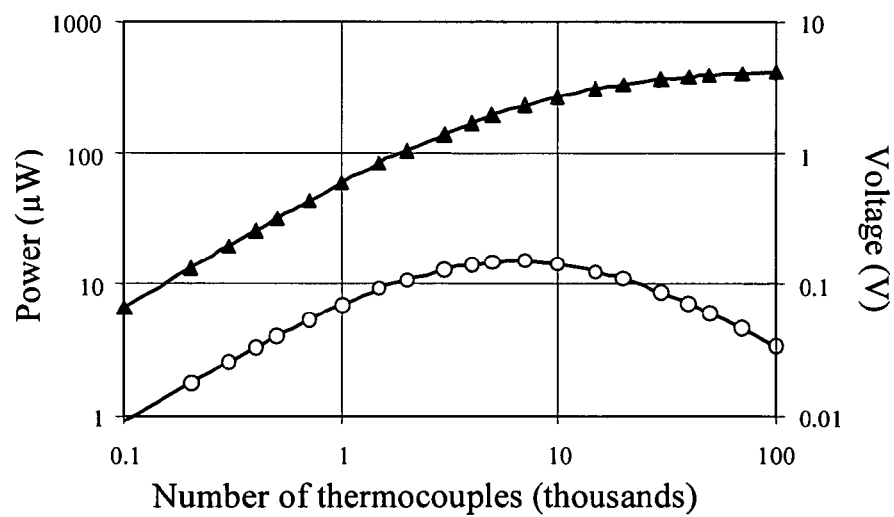
Fig. 8

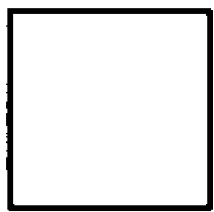 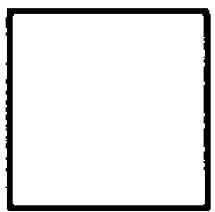 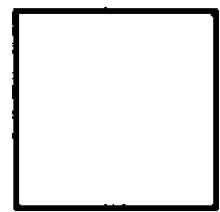 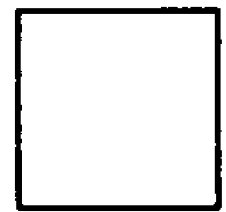
 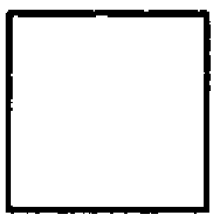 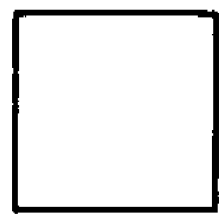 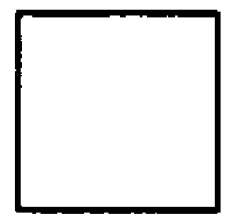
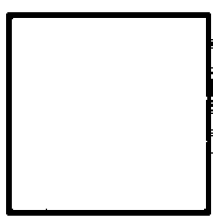 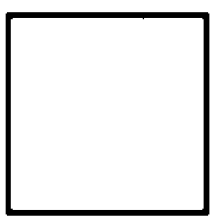 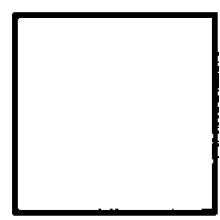 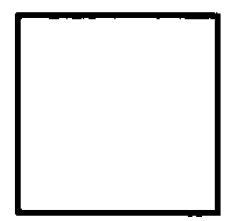
Fig. 19

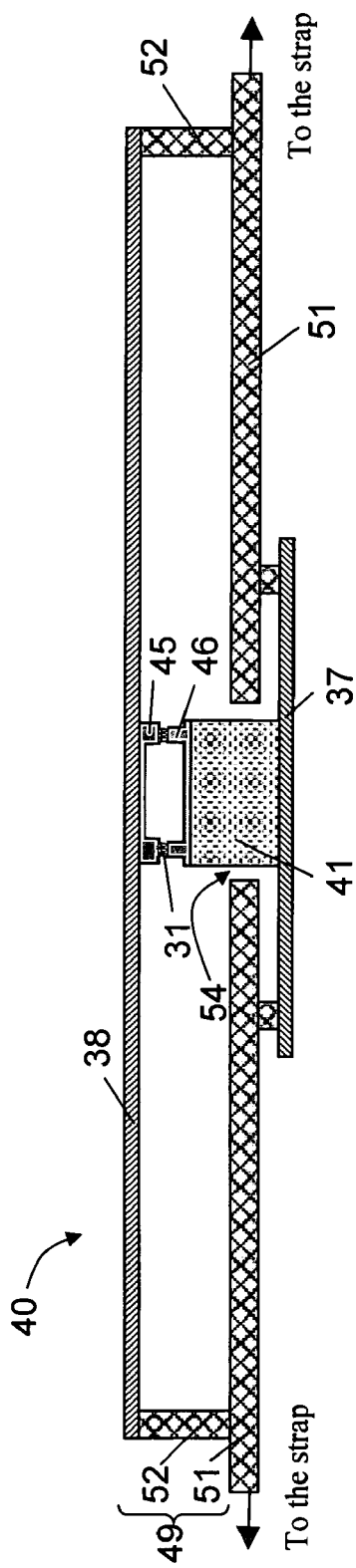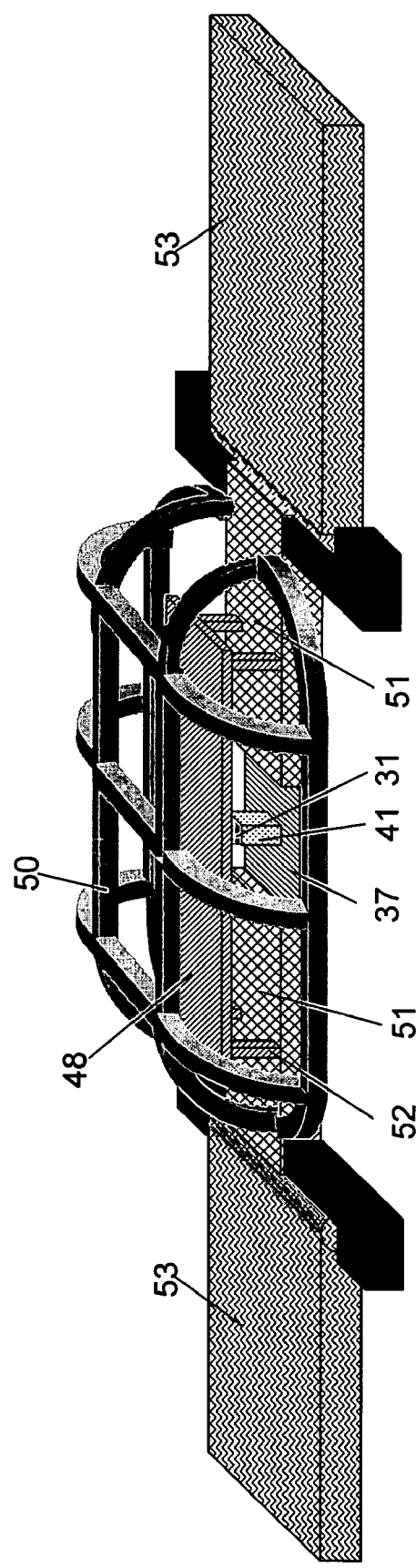

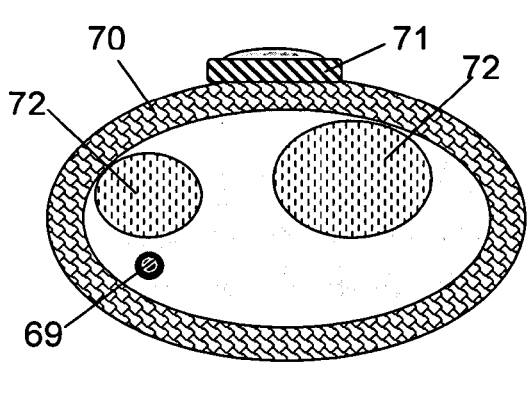
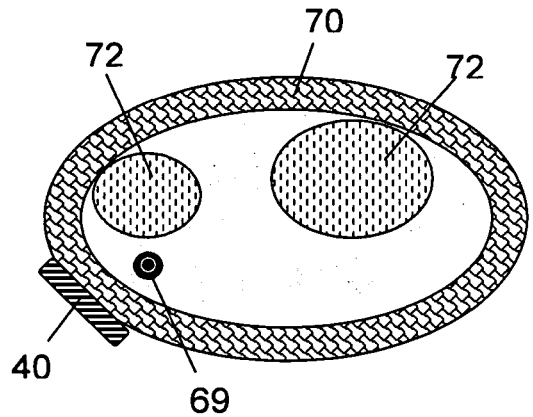
Fig. 28a  Fig. 28b
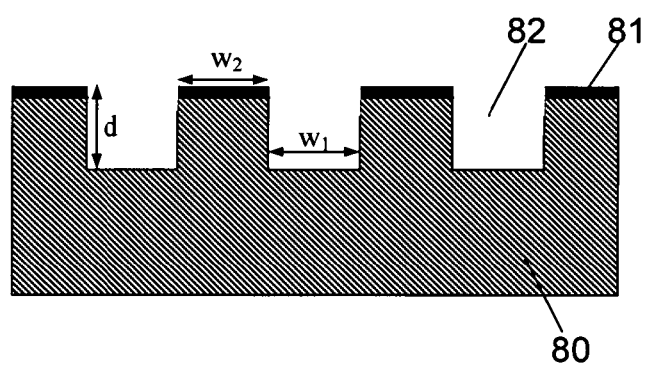
Fig. 29a
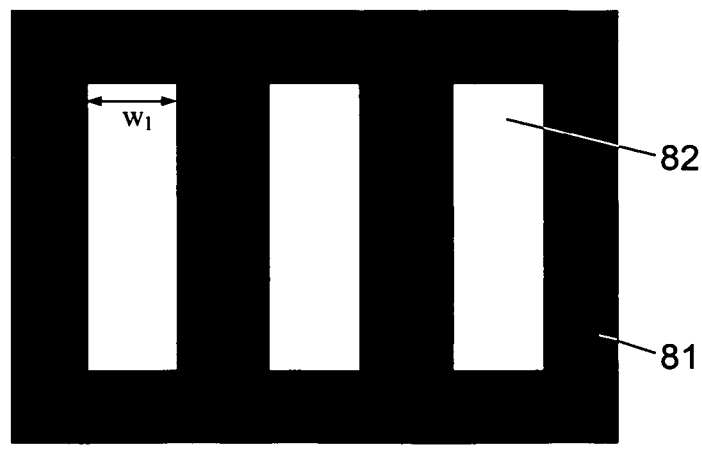
Fig. 29b

METHOD OF MANUFACTURING A THERMOELECTRIC GENERATOR AND THERMOELECTRIC GENERATOR THUS OBTAINED

RELATED APPLICATIONS

The present patent application claims priority under 35 U.S.C. §119(e) to U.S. Provisional Patent Application Ser. No. 60/651,703, which was filed Feb. 10, 2005. The present patent application also claims priority under 35 U.S.C. §119 (b) to European Patent Application No. EP 04447161.3, which was filed on Jul. 1, 2004. The full disclosures of U.S. Provisional Patent Application Ser. No. 60/584,541 and European Patent Application No. EP 04447161.3 are incorporated herein by reference.

FIELD

The present invention relates to thermoelectric generators (TEGs) and more specifically to TEGs operated with a heat source having a large thermal resistance. The invention also relates to a method of manufacturing TEGs using microelectromechanical systems (MEMS) and to the positioning of TEGs that are used on a warm object in a fluid, such as air, having a different temperature with respect to its environment, such as on a human body or on a body of a warm-blooded animal.

BACKGROUND

A TEG uses a temperature difference occurring between a hot or warm object (i.e., a heat source) and the object's colder surrounding (i.e., a heat sink) and transforms a consequential heat flow into useful electrical power. The necessary heat can be produced by radioactive materials, such as in space applications, or by sources available in the ambient, such as standard cooling/heating systems, pipe lines including pipe lines with warm waste water, surfaces of engines, parts of machines and buildings, warm-blooded animals, or human beings. Natural temperature gradients can be used, as well as geothermal temperature gradients, temperature gradients on ambient objects when naturally cooling/heating at night/day, temperature differences between a cold river and a warm shore or between a warm river and ice on it, between ice on water and surrounding air, and so on.

There is an increasing interest in miniaturized TEGs, which could replace batteries in consumer electronic products operating at low power. For example, TEGs mounted in a wristwatch have been used to generate electricity from wasted human heat, thus providing a power source for the watch itself. See M. Kishi, H. Nemoto, T. Hamao, M. Yamamoto, S. Sudou, M. Mandai and S. Yamamoto in 'Micro-Thermoelectric Modules and Their Application to Wristwatches as an Energy Source', Proceedings ICT'99 18th Int. Conference on Thermoelectrics, p. 301-307, 1999.

Recently, MEMS technology has also been used to fabricate miniaturized TEGs, as described by M. Strasser, R. Aigner, C. Lauterbach, T. F. Sturm, M. Franosh and G. Wachutka in 'Micromachined CMOS Thermoelectric Generators as On-chip Power Supply', Transducers '03. 12th International Conference on Solid State Sensors, Actuators and Microsystems, p. 45-48, 2003; by A. Jacquot, W. L. Liu, G. Chen, J.-P. Fleurial, A. Dausher, B. Lenoir in 'Fabrication and modeling of an in-plane thermoelectric micro-generator', Proceedings ICT '02. 21st International Conference on Thermoelectrics, p. 561-564, 2002; and by H. Böttner, A. Schubert, K. H. Schlereth, D. Eberhard, A. Gavrikov, M. Jägle, G. Kühner, C. Künzel, J. Nurnur and G. Plesher in 'New Thermoelectric Components using Micro-System-Technologies', ETS 2001-6th European Workshop on Thermoelectrics, 2001.

TEGs can be characterized by an electrical and a thermal resistance, and by both voltage and power generated per unit temperature difference between the hot and cold sides of the TEG. The relative importance of these factors depends on the specific application. In general, electrical resistance should be low, and voltage or power output should be maximized, in particular, in applications with a small temperature difference (i.e., a few degrees C. or few tens of degrees C.). If a fixed temperature difference is imposed at the boundaries of the TEG by, for example, means of hot and cold plates, the value of thermal resistance is not crucial. Contrary thereto, if the boundary condition is a fixed or limited heat flow through the device, then the thermal resistance, on one hand, has to be large enough to generate a reasonable temperature drop over the device, but on the other hand, has to be small enough to avoid variations in the heat flow.

The basic element of a TEG is a thermocouple 10 (FIG. 1). An example of a thermocouple 10 includes a first leg 11 and a second leg 12 formed with two different thermoelectric materials, such as the same but opposite doped semiconductor material, and exhibiting low thermal conductance and low electrical resistance. For example, the legs 11, 12 could be formed from BiTe. If the first leg 11 is formed of n-type BiTe, then the second leg 12 is formed of p-type BiTe, and vice versa. The legs 11, 12 are connected by a conductive interconnect, such as a metal layer interconnect 13, which forms a low-resistance ohmic contact to the semiconductor legs 11, 12.

In FIG. 2, a TEG 20 including a thermopile 21 having a plurality of, and preferably a large number, of thermocouples 10 is shown. The thermopile 21 is sandwiched between a hot plate 22 and a cold plate 23. The hot plate 22 and the cold plate 23 are made of materials having a large thermal conductivity, so that the thermal conductance of the plates 22, 23 is much larger (at least a factor of ten) than the total thermal conductance of the thermopile 21.

Hereinafter, the difference between classical and micromachined thermoelectric generators is discussed. Although the geometrical arrangement of the basic elements or thermocouples 10 composing the TEG 20 may be different, such as the in-plane position of the thermocouples 10 (i.e., parallel to the plates 22, 23), in classical and micromachined TEGs 20 the schemes of FIG. 1 and FIG. 2 hold for both. The difference between the two implementations is quantitative.

Typical dimensions of legs 11, 12 for a classical TEG 20 are on the order of a few millimeters for the height h and on the order of hundreds of micrometers to 1 millimeter for the square root of the cross-section, which in the further description will be referred to as lateral size a. The aspect ratio of the legs 11, 12, which is determined by height h over lateral size a (h/a), may be in the order of 1 to 3 in case of a classical TEG 20. The aspect ratio for a TEG produced by Seiko, i.e., a classical TEG, is 7.5. The smallest thermopiles 10 currently available on the market (Thermix; Kiev, Ukraine) demonstrate an aspect ratio of less than 5. For micromachined TEGs 20, the lateral size a is on the order of a few micrometer, and the aspect ratio h/a can be larger than in the case of a classical TEG (e.g., more than 10).

In case of a constant or limited heat flow through the TEG 20, the output voltage and power depend on the number of thermocouples 10 comprised in it, and it can easily be shown that the maximum power is obtained when the heat flow through the thermoelectric material is equal to the "parasitic" heat flow through the air, including radiation heat exchange.

In order to give numerical examples, the TEG device area is fixed to 1 cm² and the heat flow to 18.5 mW/cm², which is a typical heat flow from a human body skin. Furthermore, it is assumed that the legs 11, 12 of the thermocouples 10 are respectively made of n-type and p-type BiTe, and that the TEG 20 operates in air. The thermal resistance of the metal layer interconnect 13 and the electrical resistance of the contacts between the legs 11, 12 of the thermocouple 10 and the metal layer interconnect 13 are considered to be negligible. Values used for the calculations are reported in Table I.

TABLE I

Parameters used for the calculation of TEG performance

| Parameters | Value |
| --- | --- |
| Thermal conductivity of BiTe, W K⁻¹m⁻¹ | 1.5 |
| Thermal conductivity of air, W K⁻¹m⁻¹ | 0.026 |
| Resistivity of BiTe (n and p), Ωm | 10⁻⁵ |
| Input heat flow, Wm⁻² | 185 |

First, a classical TEG 20 is considered. Dimensions chosen for the legs 11, 12 are close to those of the best currently available commercial devices, i.e., a lateral size a of 250 μm and a height h of 750 μm. In FIG. 3, the output power $P_{out}$ (full line) and output voltage $V_{out}$ (dashed line) for such a TEG 20 are illustrated as a function of the number of thermocouples 10. In correspondence of the maximum power, the output voltage is low (i.e., 15 mV) as can be seen from FIG. 3, which is well below the level necessary for powering standard electronics. Typical voltages are 3 to 5 V. It is well known in the art to up-convert 800 mV to these values; however, it is much more difficult and less efficient to reach these values starting from 300 mV or less.

As can be seen in FIG. 4, the temperature drop corresponding to the maximum power is about 2.3 K. The performance of the TEG 20 can be improved by increasing the aspect ratio of the legs 11, 12. For example, as described by M. Kishi, H. Nemoto, T. Hamao, M. Yamamoto, S. Sudou, M. Mandai and S. Yamamoto in 'Micro-Thermoelectric Modules and Their Application to Wristwatches as an Energy Source', Proceedings ICT'99 18th Int. Conference on Thermoelectrics, p. 301-307, 1999, the lateral size a and height h of the legs 11, 12 are respectively 80 μm and 600 μm. In this case, a 0.4 cm² TEG (10 units of 2×2 mm size are used in the watch) gives a voltage of 0.25 V when it delivers a maximum power of about 20 μW. Although the aspect ratio, h/a, of the thermoelectric legs 11, 12 of 7.5 (=600 μm/80 μm) in the above example represents a current technological limit, the voltage obtained is still of impractical use. It can thus be concluded that the low output voltage is a main restriction to a wide use of the TEGs 20 operated in a low heat flow mode.

Next, a micromachined TEG 20 is considered which comprises legs with a thickness of 0.5 μm, a width of 1 μm and a height of 5 μm. In FIG. 5, the output power (○) and voltage (▲) are shown as a function of the number of thermocouples 10. The power is limited to only 0.11 μW. This maximal power is achieved for a TEG 20 having about 1.8 million thermocouples 10 (see FIG. 5). For the same number of thermocouples 10, a voltage of about 3V is obtained. In FIG. 6, the temperature difference (○) and the electrical resistance (▲) of a micromachined TEG 20 are reported. The temperature difference (○) of the TEG 20 at the maximal power is limited to 18 mK. The corresponding thermal resistance, which is determined by $R_{th}=\Delta T/P$ (with ΔT=a temperature drop and P the heat flow) is 1 K/W, which is not enough to obtain a good temperature drop.

The above results are confirmed by experimental data. For example, as described by M. Strasser, R. Aigner, C. Lauterbach, T. F. Sturm, M. Franosh and G. Wachutka in 'Micromachined CMOS Thermoelectric Generators as On-chip Power Supply', Transducers '03, 12th International Conference on Solid State Sensors, Actuators and Microsystems, p. 45-48, 2003, a large number of thermocouples 10 has been fabricated and a large output voltage is obtained. H. Böttner, A. Schubert, K. H. Schlereth, D. Eberhard, A. Gavrikov, M. Jägle, G. Kühner, C. Künzel, J. Nurnur and G. Plesher point out in 'New Thermoelectric Components using Micro-System-Technologies', ETS 2001—6th European Workshop on Thermoelectrics, 2001, that both the temperature drop and the output power are low in micromachined TEGs 20. For example, micromachined TEGs produced by Infineon show about 10 mK temperature difference between the hot and the cold side (H. Böttner in 'Thermoelectric Micro Devices: Current State, Recent Developments and future Aspects for Technological Progress and Applications', International Conference on Thermoelectrics, 2002). However, experimental conditions have not been published.

For the number of thermocouples 10 at which the maximum power is achieved (see FIG. 5), the electrical resistance approaches 0.4 GΩ (see FIG. 6), which is a too high of a value for a generator powering electronic devices or battery chargers. It can be seen that the optimal number of thermocouples 10 is about 1.8 million, because in that case the thermal resistance of air is equal to the thermal resistance of thermopile or in series connected thermocouples 10, so the output power is maximized. This large number of thermocouples 10 can be fabricated if one thermocouple 10 occupies a square of only about 7×7 μm² size. This is a difficult but not impossible task. The large number of thermocouples 10 furthermore has the drawback of increased probability of getting a non-functioning device, since thermocouples 10 are electrically coupled in series. Hence, the failure of one thermocouple 10 will cause the failure of the whole TEG 20. This drawback potentially leads to a dramatically decreased yield of good devices and increased cost of manufacturing.

In order to understand the difference in behavior between a classical and a micromachined TEG 20, a thermal analysis is performed of the TEG configuration as illustrated in FIG. 2. Analytical results are reported and discussed hereinafter. The number of thermocouples n, the temperature drop ΔT, and the output voltage $V_{out}$ at a maximal power $P_{out}$ are given by the expressions (1) to (4):

$$n = \frac{G_{air}h}{g_{te}a^2} = \frac{Ag_a}{g_{te}a^2}, \tag{1}$$

$$P_{out} = \frac{1}{16}S^2 \frac{W_u^2 A^2}{g_{te}\rho} \frac{1}{G_{air}} = \frac{1}{16}S^2 \frac{W_u^2 A}{g_{te}\rho} \frac{h}{g_a}, \tag{2}$$

$$\Delta T = \frac{W_u A}{2G_{air}} = \frac{W_u h}{2g_a}, \tag{3}$$

$$V = \frac{W_u AS}{g_{te}} \frac{h}{a^2}, \tag{4}$$

wherein
A is the area of the hot/cold plate 22, 23,
a is the lateral size of the legs 11, 12,
h is the height of the legs 11, 12,
$g_a$ is the thermal conductivity of air, $g_{te}$ is the thermal conductivity of the thermoelectric material the legs 11, 12 are made of, ρ is the resistivity of the thermoelectric material the legs 11, 12 are made of, S is the Seebeck coefficient (assumed to be equal for both legs 11, 12), $G_{air}$ is the thermal conductance of the air between the hot plate 22 and the cold plate 23, and $W_u$ is heat flow per unit area.

Equations (1) and (2) show that, at the maximum power condition, the number n of necessary thermocouples and the output voltage depends on the ratio $h/a^2$, which is much larger for a micromachined TEG than for a classical one. It can then be stated that micromachined thermoelectric generators require a larger number of thermocouples and deliver power at a larger voltage. The power $P_{out}$ and temperature difference ΔT (respectively, equations (2) and (3)) depend mainly on the thermal conductance $G_{air}$ of the air between hot plate and the cold plate. Since this thermal conductance $G_{air}$ is larger for micromachined thermopiles, the temperature drop ΔT and power $P_{out}$ are low for these devices.

SUMMARY

A thermoelectric generator (TEG) and method for manufacturing the TEG is described. The TEG is designed so that the parasitic thermal resistance of air and the height of the legs can be varied and optimized independently.

In an example, a TEG is provided that includes at least one thermopile positioned in between a first plate and a second plate. Each thermopile includes a plurality of thermocouples and has a footprint with a base area. The thermocouples that form the thermopile may be SiGe or BiTe thermocouples.

The TEG also includes at least one spacer for separating the at least one thermopile from at least one of the first plate or the second plate. The plurality of thermocouples is distributed on a raised elongate structure over an area of one of the first plate or the second plate substantially larger than the total base area of the plurality of thermocouples. Total base area is the sum of the base areas of the thermocouples. The TEG may be characterized by a goodness value. For example, the TEG may show an output power $P_{out}$ and an output voltage V such that the $V*P_{out}$ product is at least 0.5 µWV.

In another example, a TEG is provided that includes at least one thermopile positioned in between a first plate and a second plate, each thermopile comprising a plurality of thermocouples, each thermocouple having a footprint with a base area. The TEG also includes at least one spacer for separating the at least one thermopile from at least one of the first plate or the second plate. The TEG shows an output power $P_{out}$ and an output voltage V such that the $V*P_{out}$ product is at least 0.5 µWV. The thermocouples have two legs with a height h. Preferably the spacer has a height that is at least ten times larger than the height of the thermocouple legs. The first and the second plate may be, for example, one of a hot and a cold plate. The thermopile may be positioned on top of a raised elongate structure, such as in the form of a rim or flat topped wall structure.

An advantage of the TEG is that it shows a higher density of thermocouples. Thus, a reduced number of thermopiles is needed for some TEG applications, for example, for wrist applications. Hence, by using a reduced number of thermocouples with respect to other micromachined devices, the electrical resistance may decrease by a factor of 300 and the yield problems may be less severe.

In order to provide a good thermal contact between the top of the thermocouples, and the first or second plate, the TEG may include a heat-sink or a heat-spreading chip/structure in between the thermopile and one of the first plate or the second plate.

The TEG may also include a spacer in between the thermopile and one of the first plate or the second plate. In this arrangement, the parasitic thermal conductance through air between the first plate and the second plate outside the thermopile chip is mainly controlled by the total height H of the basic element, and is, as desired, very low. Additionally, the parasitic thermal conductance through air between spacers and inside the thermopile, and the behavior of the thermocouple is controlled by the ratio $h/a^2$, which is preferably as large as possible, unless it decreases the surface density of the thermocouples.

The second plate may be a cold plate and the TEG may include a radiator mounted on the cold plate. By incorporating a radiator in the TEG, the contact area between the cold plate and air may be increased. By doing so, the heat flow from a body may be improved. The radiator may be manufactured in any suitable shape, taking into account its performance, but also its attractive view, cost of manufacturing, different possible applications, and related aspects.

The first plate may have a first size and the second plate may have a second size. The first size is different than the second size. By making the first plate and the second plate unequal in size, and by matching the heat transfer coefficients of the first plate and second plate, a significant improvement of the generated power and voltage may be achieved. In one example, the first size or the size of the first plate may be smaller than the second size or the size of the second plate. The first plate may be a hot plate and the second plate may be a cold plate, the hot plate being smaller than the cold plate.

The TEG may include a shock-protecting structure and/or a touch protecting structure to protect the TEG from external factors, such as touching of the thermoelectric generator with fingers. The shock-protecting structure may include a thermally isolating plate with pillars composed of a thermally isolating material connected to one of the first plate or the second plate. The thermally isolating plate may include a hole in which the spacer may be positioned.

The TEG may include a thermal screen or shield positioned in between and thermally isolated from both the hot plate and the cold plate. By providing such a thermal screen, the parasitic thermal conductance inside the thermoelectric generator between the first plate and the second plate may be minimized.

The TEG may be attached to a device to bring the TEG into contact with a wrist or other body parts, of a human or warm blooded animal. For example, the device may be a wrist-strap. This is the case when the TEG is used for wrist applications. The TEG may be mounted on a clamp for attaching to a piece of clothing so that one of the first plate or the second plate is in contact with skin of the human being or other warm blooded animal. The clamp may include heat isolating paths positioned on the radiator for providing direct contact of the radiator to the piece of clothing. The clothing may be made with cotton.

In another example, a method for the manufacturing of a TEG includes providing at least one thermopile on a substrate, providing and mounting a first plate and a second plate, and providing at least one spacer in between the thermopile and at least one of the first plate or the second plate. Each thermopile includes a plurality of thermocouples. Each thermocouple has a footprint with a base area.

Providing the at least one thermopile on a substrate includes providing the plurality of thermocouples distributed on a raised elongate structure over an area of one of the first plate or the second plate substantially larger than the total base area of the plurality of thermocouples. The thermocouples have two legs and an associated height. The height of the spacer may be at least ten times larger than the height of the thermocouples. Providing the plurality of thermocouples distributed on the raised elongate structure may include etching away areas on the substrate where no thermopiles are positioned. Etching may for example be performed by applying deep reactive ion etching.

The method may also include providing a heat-sink or heat-spreading chip in between the at least one thermopile and one of the first plate or the second plate. This may be done in order to provide a good thermal contact of one side (e.g., the top) of thermocouples to the first or second plate.

When the second plate is a cold plate, the method may also include providing a radiator on top of the cold plate. By incorporating a radiator in the TEG device, the contact area between the cold plate and air may be increased. By doing so, the heat flow from a body can be improved. The radiator may be manufactured in any suitable shape, taking into account its performance, but also its attractive view, cost of manufacturing, different possible applications, and related aspects.

The method may also include providing a shock-protecting structure and/or a touch-protecting structure to protect the thermoelectric generator from external factors, such as for example touching of the TEG with fingers, for example.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 1 is a perspective view of a thermocouple comprising an n-type and a p-type semiconductor leg and a metal layer interconnect;

FIG. 2 is a perspective view of a TEG having a number of thermocouples sandwiched between a hot plate and cold plate;

FIG. 3 is a graph depicting voltage (---) and power (—) as a function of the number of thermocouples for the classical BiTe TEG depicted in FIG. 2;

FIG. 4 is a graph depicting temperature drop as a function of the number of thermocouples for the classical BiTe TEG depicted in FIG. 2;

FIG. 5 is a graph depicting voltage (▲) and electrical power (○) transmitted into a matched load for a micromachined BiTe TEG;

FIG. 6 is a graph depicting temperature difference (○) between hot and cold plates and electrical resistance (▲) of a micromachined BiTe TEG;

FIG. 7a is a perspective view of a basic element of a thermopile for forming a thermopile chip, according to an example;

FIG. 7b is a side view of a thermopile chip sandwiched between two plates, according to an example;

FIG. 8 is a graph depicting voltage (▲) and power (○) generated by the thermopile depicted in FIG. 7b;

FIG. 19 is a pictorial representation of examples of distributed thermopiles in a discontinuous structure, according to an example;

FIG. 22 is a cross-sectional view of a TEG, according to another example;

FIG. 23 is a perspective view of the TEG depicted in FIG. 22 attached to a watchstrap, according to an example;

FIG. 28a and FIG. 28b are pictorial representation depicting positioning of a watch and optimal positioning of a TEG in a wrist application, according to an example;

FIG. 29a to FIG. 29l illustrate a fabrication process for SiGe thermopiles, according to an example;

DETAILED DESCRIPTION

Figure 9:
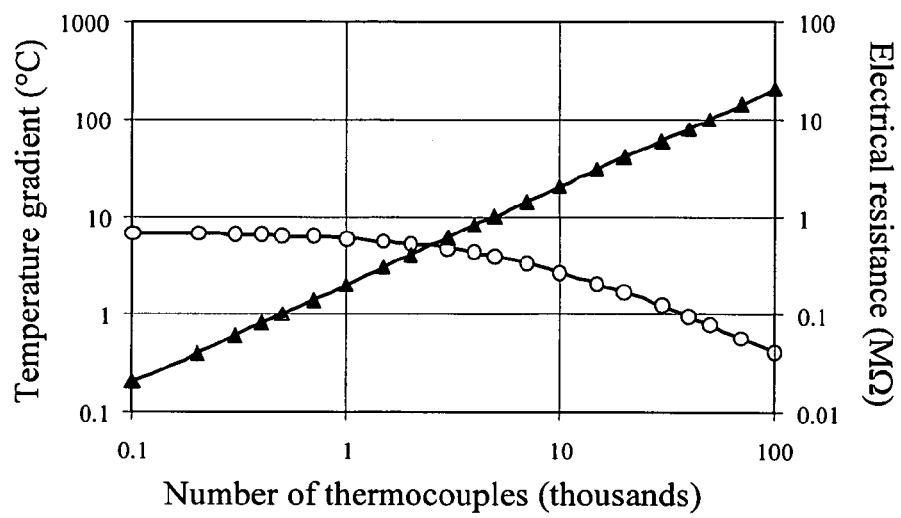
FIG. 9 is a graph depicting temperature difference (○) between the hot and cold plates and the electrical resistance (▲) of the thermopile chip depicted in FIG. 7b.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions may not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Three parameters, called Figures of Merit (FOMs), are used to illustrate and quantify the advantage of the TEG as described herein. The FOMs are provided for BiTe TEGs at a resistivity of BiTe of 1 Ωcm, a thermal conductivity of 15 mW/cmK, a Seebeck coefficient of 0.2 mV/° C. and the following conditions of application on a human body:

(i) the temperature inside the body $T_{in}$ is 37° C.,
(ii) the environmental temperature $T_{room}$ is 20° C.,
(iii) still air,
(iv) the thermal resistance of the body $R_{th}$ is 300 cm² K/W,
(v) the contact area of the device with the skin is 1 cm², and
(vi) the distance between the first, hot, plate and the second, cold, plate is 1.5 mm without spacer being used, and 5 mm after inserting an additional spacer.

One advantage of the TEG described herein is a large output voltage combined with a large output power. Thus a first FOM may be defined as:

$$FOM_1 = V^* P_{out} \quad (5)$$

Under the above proposed conditions, a classical TEG shows good output power (in the order of 15 µW), but unacceptably low voltage (in the order of 15 mV), while the micromachined TEG 20 demonstrates good output voltage (in the order of 3 V) but unacceptably low output power (in the order of 0.10 µW).

Another important property of the thermal design of a TEG is the ratio of thermal resistance $R_{th,tp}$ between the hot and cold ends of the thermopile to the thermal resistance $R_{th,source-sink}$ between the heat source and the sink. This ratio is of lesser importance when the thermopile is used with a constant temperature difference between the hot plate and the cold plate coupled to large heat sinks. However, this ratio becomes more important in the case of constant or limited heat flow. This ratio is equal to the coefficient of utilization of the temperature difference, $C_T$, occurring between the heat source and the sink. In the above case this coefficient can be defined as:

$$C_T = R_{th,tp}/R_{th,source-sink} = \Delta T_{tp}/\Delta T_{source-sink} = \Delta T_{tp}/(T_{in} - T_{room}) \quad (6)$$

wherein $\Delta T_{tp}$ is the temperature drop over the thermopile.

A classical TEG shows a good $C_T$ of about 1.3° C. if operated on a human body [M. Kishi, H. Nemoto, T. Hamao, M. Yamamoto, S. Sudou, M. Mandai and S. Yamamoto in 'Micro-Thermoelectric Modules and Their Application to Wristwatches as an Energy Source', Proceedings ICT'99 18$^{th}$ Int. Conference on Thermoelectrics, p. 301-307, 1999.], while the micromachined TEG demonstrates a poor value of $C_T$ of only 10 mK [Böttner, A. H. Böttner in 'Thermoelectric Micro Devices: Current State, Recent Developments and future Aspects for Technological Progress and Applications', International Conference on Thermoelectrics, 2002 (ICT2002)]. Therefore, it is useful to account for this coefficient in a FOM for comparison of different technologies.

The aspect ratio is also an important feature of a TEG. However, the aspect ratio of a classical TEG can be limited in applications in which thin TEGs are required, such as the TEGs having a 1 mm total thickness including their package. For a micromachined TEG the distance in between the hot plate and the cold plate does not limit the aspect ratio, while the thickness of the substrates could be varied. Therefore, it is important to include the capability of the TEG to fit to the minimal thickness requirements of a TEG. The TEG according to this invention demonstrates significantly large temperature drop on the thermopile per unit height of the legs in case of constant or limited heat flow. So, short legs, i.e., a few µm, guarantee a large temperature difference obtainable on the thermopile, which is accounted for here together with $C_T$ using a second FOM, which is:

$$FOM_2 = \Delta T_{tp}/(h(T_{in} - T_{room})) \quad (7)$$

By combining FOM1 and FOM2 as their product, a third FOM may be obtained and used here for comparison. The third FOM is defined as:

$$FOM_3 = V^* P_{out}^* \Delta T_{tp}/(h(T_{in} - T_{room})) \quad (8)$$

When, for example, the cold and the hot plate have an area of 1 cm², the distance between the hot and cold plate is not larger than 1.5 mm, and the TEG is positioned on part of a human body, operated at regular ambient temperature, and dissipating the heat into still air, the $V^* P_{out}^* \Delta T_{tp}/(h(T_{in} - T_{room})$ or $FOM_3$ may be at least 0.5 WV/m. $FOM_3$ may further be improved by increasing the distance between the hot plate and the cold plate.

FIG. 7a shows a basic element 30 of a thermopile 31 (see FIG. 7b). The basic element 30 comprises two plates 32, 33. The two plates 32, 33 are made of a material with a high thermal conductivity which is at least ten times higher than the thermal conductivity of a thermocouple 34. The plates 32, 33 may be composed of Si, Al, AlN, Al$_2$O$_3$, and Cu, for example. However, any other suitable material can be used as well.

In the example depicted in FIG. 7a, the thickness of the plates 32, 33 is equal to (H−h)/2, wherein H is the total thickness of the basic element 30 and h is the height of a thermocouple 34 that is sandwiched in between the two plates 32, 33. For example, the thickness of the plates 32, 33 may be a few hundred micrometers.

The thermocouple 34 has two legs 35, 36 formed out of dissimilar thermoelectric materials. For example, the legs 35, 36 may be formed out of the same semiconductor material doped with impurities of an opposite dopant type. Thus, the first leg 35 may be composed of a semiconductor material doped with impurities of a first type and the second leg 36 may be composed of a semiconductor material doped with impurities of a second type, which is the opposite dopant type as the first type. The first type of impurities may be n-type impurities, such as arsenic (As), phosphorus (P), antimony (Sb), or combinations thereof. The second type of impurities may be p-type impurities such as boron (B), fluorine (F), nitride (N), indium (In), chlorine (Cl), or combinations thereof. As an example only, the legs 35, 36 may be formed of BiTe. If leg 35 is made of n-BiTe (doped with phosphorus), then leg 36 is made of p-BiTe (doped with boron). As another example, the legs 35, 36 may be formed of SiGe.

The lateral size b of the plates 32, 33 may be in the order of 10-20 times the lateral size of a leg 35, 36 of a thermocouple 34. For example, the lateral size b of the plates 32, 33 may be 10 μm or less. The plate size may be limited by the ability of making a thermopile 31 on the plates 32, 33. Preferably, the lateral size of the plates 32, 33 is as small as technically possible. The thermocouple 34 in between the plates 32, 33 may have a lateral size a on the order of 1 μm and a height h on the order of several μm. The thermocouple 34 may be a micromachined thermocouple.

An increasing number of the basic elements 30 may be inserted between a first, hot plate 37 and a second, cold plate 38. This is equivalent to inserting a chip with increasing area and comprising an increasing number of thermocouples 34, as shown in FIG. 7b, in between the hot plate 37 and the cold plate 38, forming the TEG 40. Hereinafter, this chip will be referred to as the thermopile chip 39.

The thermopile chip 39 includes a thermopile 31, which is formed by a number of thermocouples 34 connected in series. The thermopile chip 39 also includes two pillars 41a,b, one at each side of the thermocouple 34 and each formed by respective plates 32, 33. The pillars 41a,b are referred to as spacers 41a,b as they separate the thermocouples 34 from the hot plate 37 and the cold plate 38.

FIG. 7b suggests that in this arrangement the parasitic thermal conductance through air between the hot plate 37 and the cold plate 38 outside the thermopile chip 39 is mainly controlled by the total height H of the basic element 30, and is, as desired, very low; while the parasitic thermal conductance through air between spacers 41a and 41b inside the thermopile 39 is controlled by the ratio $h/b^2$ and the behavior of the thermocouple 34 is controlled by the ratio $h/a^2$, which preferably are as large as possible. Limitation to this value may come from technology and from the maximum space which can be occupied by the TEG 40. Typical values for a and h may be 1 μm and 5 to 20 μm, respectively.

In FIG. 7b, the TEG 40 is illustrated as having a thermopile 31 sandwiched between two spacers 41a,b. However, other configurations are also possible. For example, instead of two spacers 41a,b, only one spacer 41a or 41b may be provided, either between the thermopile 31 and the cold plate 38, or between the thermopile 31 and the hot plate 37. Furthermore, the size (e.g., the thickness) of the spacers 41a,b may be adapted in order to achieve the best performance for specific applications.

The performance of the TEG 40 as illustrated in FIG. 7b may be described by the following formulas:

$$n = \frac{G_{air}}{\left[\frac{g_a b^2 + g_{tc} a^2}{h}\right]} \quad (9)$$

$$P_{pout} = \frac{1}{16} S^2 \frac{W_u^2 A^2}{\rho} \frac{1}{G_{air}} \frac{1}{g_{te} + \frac{b^2}{a^2} g_a} \quad (10)$$

$$V = S \frac{WA}{2} \left[\frac{h}{g_a b^2 + g_{te} a^2}\right] \quad (11)$$

For comparing these expressions with the expressions obtained above for the micromachined TEG 20, typically $g_a$ is about 100 times less than $g_{te}$. This means that until b is smaller than 10a, the term $g_a b^2$ is smaller than $g_{te} a^2$. As a consequence, approximating $(g_a b^2 + g_{te} a^2)$ with $g_{te} a^2$ will result in an error of at most a factor of 2. With this in mind, it has to be noticed that expression (9) for the maximal number of thermocouples 34 and expression (10) for the power are the same as expressions (1) and (2). However, according to the present invention, $G_{air}$ is now small. As a consequence, the number of thermopiles 34 to obtain the maximal power may greatly be reduced, and the maximal power may be increased. The expression (11) of the voltage is also similar to expression (4), and mainly depends on the dimensions of the thermocouples 34, i.e., h/a. The output voltage is large as desired.

FIG. 8 shows the dependence of power (○) and voltage (▲) on the number of thermocouples 34 for the TEG 40 illustrated in FIG. 7b. In the calculations, the following values have been used: H=1.5 mm, b=5 μm, h=5 μm, and a=0.7 μm. The maximal power is 15 μW, which is more than 100 times larger than the maximal power obtainable in the TEG 20 (see FIG. 5 and as described by M. Strasser, R. Aigner, C. Lauterbach, T. F. Sturm, M. Franosh and G. Wachutka in 'Micromachined CMOS Thermoelectric Generators as On-chip Power Supply', Transducers '03. $12^{th}$ International Conference on Solid State Sensors, Actuators and Microsystems, p. 45-48, 2003). However, the performance of these devices if placed on a human body has not been demonstrated.

Furthermore, the maximal power of 15 μW is significantly better than the power obtained or estimated for a classical TEG produced by Seiko and as described by M. Kishi, H. Nemoto, T. Hamao, M. Yamamoto, S. Sudou, M. Mandai and S. Yamamoto in 'Micro-Thermoelectric Modules and Their Application to Wristwatches as an Energy Source', Proceedings ICT'99 $18^{th}$ Int. Conference on Thermoelectrics, p. 301-307, 1999. In the latter paper, the watch diameter is about 3 cm, so the power of 22.5 μW estimated in the paper, corresponds to about $22.5/(\pi \times 3^2/4)=3.2$, or approximately 3 μW/cm² of contact area to the skin. The voltage is 2.3 V, which is only slightly less than the 3V obtained for the TEG 20, despite the fact that the number of thermocouples 34 with respect to the micromachined TEG 20 is significantly decreased.

FIG. 9 illustrates the corresponding electrical resistance (▲) and the corresponding temperature difference ΔT (○), which now reaches several ° C. when the thermocouple number n is small, and which equals 3.3° C. for the optimal value of n=7000.

The micromachined TEG 20 could be manufactured as shown in FIG. 2 and has a large number of thermocouples 34 if optimized. Actually, an in-plane orientation of the thermocouple legs 35, 36 has been used in a TEG produced by Infineon. On a 3.2×2.2 mm² chip area, 15872 cells are manufactured. One cell of their device represents 2 thermocouples 34 and occupies 49×10.9 μm² area (i.e., 49×5.45 μm² area per one thermocouple 34 and about 31700 thermocouples 34 per chip), as described by M. Strasser, R. Aigner, C. Lauterbach, T. F. Sturm, M. Franosh and G. Wachutka in 'Micromachined CMOS Thermoelectric Generators as On-chip Power Supply', Transducers '03. 12$^{th}$ International Conference on Solid State Sensors, Actuators and Microsystems, p. 45-48, 2003. As compared with a classical thermopile (e.g., as Seiko has demonstrated $0.3/(\pi \times 3^2/4)=0.042$ V/cm², or approximately 40 μV/cm²), the calculations give a voltage rise of more than 50 times (2.3 V/0.042 V).

Hereinafter, the surface density of the thermocouples, compared for (i) a classical TEG, (ii) a micromachined TEG, and (iii) a TEG according to the present invention is:

(i) A classical TEG produced by Seiko comprises a 2×2 mm² chip with 52 thermocouples 34. This is 52/4 mm²=13 thermocouples/mm².

(ii) Infineon demonstrated a micromachined TEG with 15872×2/(3.2×2.2)=4500 thermocouples/mm².

(iii) For embodiments of the present invention, 30 μm²/thermocouple, i.e. a density of $10^6/30=3\times10^4$ mm$^{-2}$, is achieved, which is a better density than the other devices. Since the optimal number of thermocouples 34 required is less than the number of thermocouples 34 that can be obtained on 1 mm² of a chip surface, the present invention needs less chip surface.

A comparison between classical and micromachined TEGs 20 on the one hand and the TEG 40 according to the present invention on the other hand are listed in Table II.

TABLE II

Comparative Figures of Merit for three TEG types.

| Technology/ TEG type | Figures of Merit (FOMs) for a TEG with 1 cm² area of contact between the TEG and the skin of a human being | | |
|---|---|---|---|
| | FOM$_1$ (μWV) | FOM$_2$ (μm$^{-1}$) | FOM$_3$ (W V/m) |
| 1. Classical (calculated) | 0.4 | $2 \times 10^{-4}$ | $8.3 \times 10^{-5}$ |
| 1. Classical (Seiko watch, estimated) | 0.09 | $1.2 \times 10^{-4}$ | $1.1 \times 10^{-5}$ |
| 2. Micromachined but no pillars (calculated) | 4.6 | $4 \times 10^{-3}$ | 0.018 |
| 2. Micromachined (Infineon, estimated) | 0.2 | $6.4 \times 10^{-5}$ | $1.3 \times 10^{-5}$ |
| 3. On a spacer (TEG 40) | 16.7 | $2.6 \times 10^{-2}$ | 0.44 |

The values for the "Classical" TEG are obtained by (1) calculating and (2) performing (estimated) calculations for the Seiko approach. Calculations are carried out for a 2×2 mm² chip size of Seiko comprising thermocouples 34 with leg dimensions h=600 μm and a=80 μm. For an optimal number of thermopiles 31 at specified conditions (temperature $T_{in}$ inside the body 37° C., environmental temperature $T_{room}$ 20° C., thermal resistance of the body $R_{th}$ 300 cm² K/W, contact area of the device with the skin is 1 cm², and distance between the hot and the cold plates is 1.5 mm), the best FOMs obtained are illustrated in table II.

Values for "Micromachined" TEGs are (1) calculated for a TEG having thermopiles being positioned on a spacer and (2) estimated in the case of a chip size not less than 2×2 mm², as it is too difficult to dice and handle/mount/align smaller-size chips. It is not surprising that the maximum occurs at a highest density of the thermocouples and at the minimal die size (again, a 2×2 mm² chip size was taken into consideration).

Figure 10A:
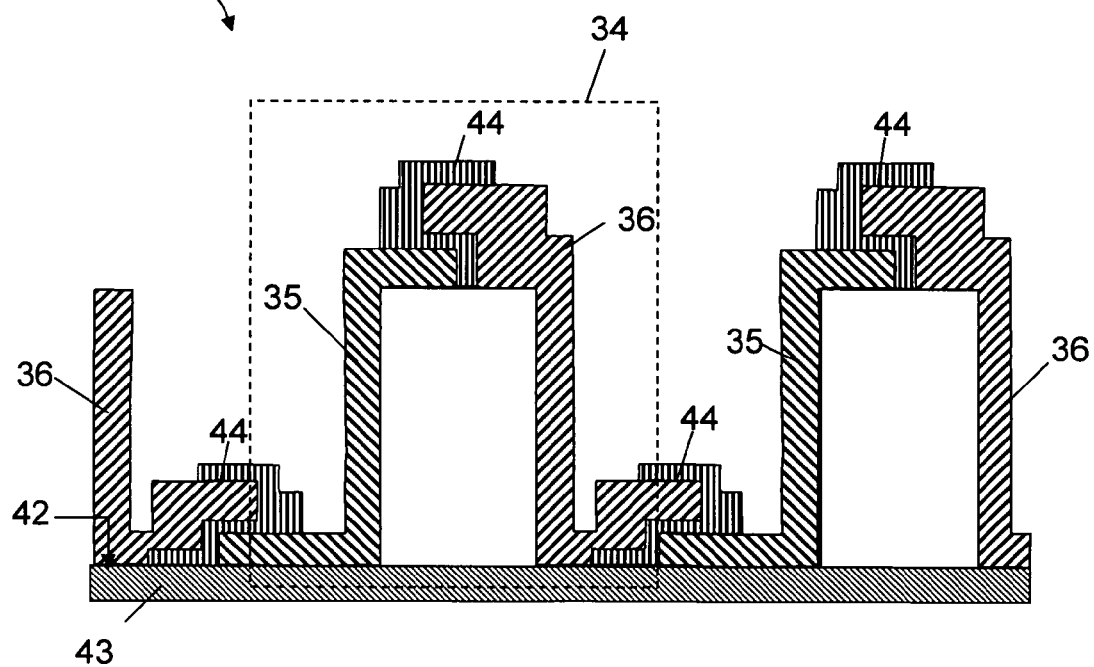
FIG. 10a is a side view of a thermopile, according to an example.
Figure 10B:
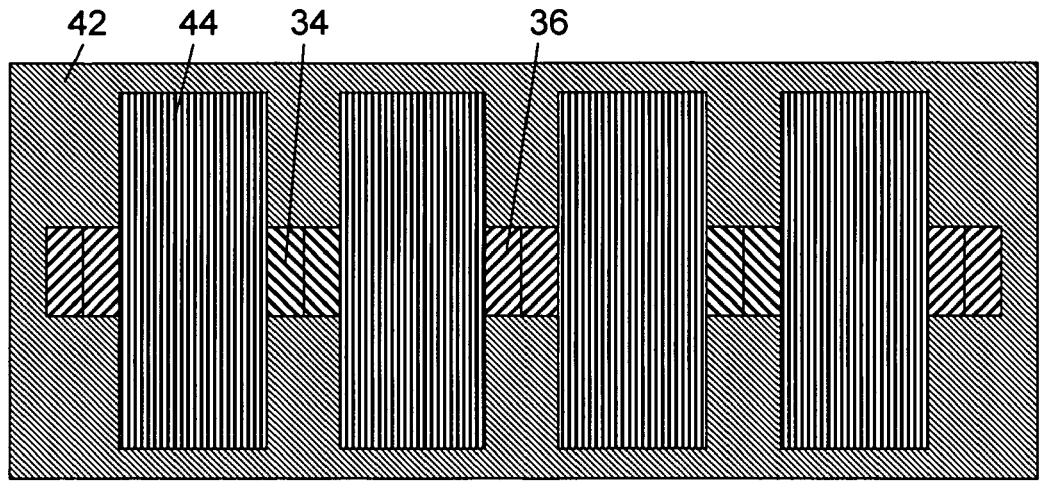
FIG. 10b is a top view of a thermopile, according to an example.
Figure 11:
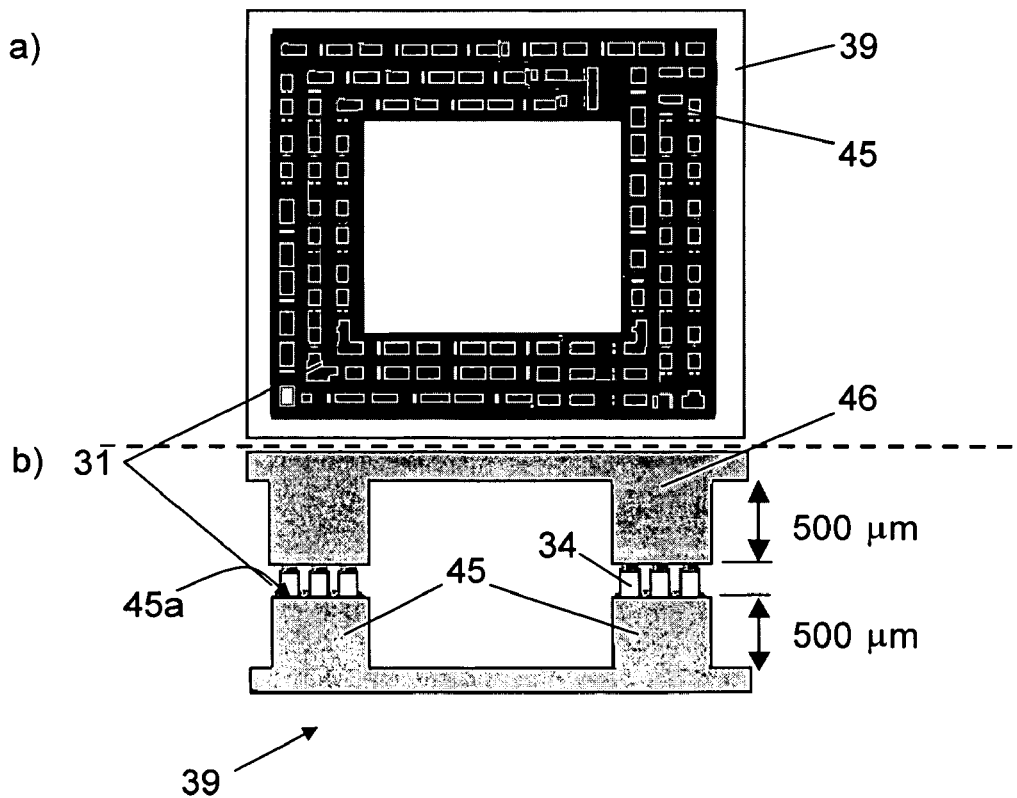
FIG. 11a is a top view of a thermopile chip with the thermopile placed on top of a rim or elongate raised structure and with a heat-sink chip in thermal contact with the thermopile chip, according to an example.
FIG. 11b is a side view of a thermopile chip with the thermopile placed on top of a rim or elongate raised structure and with a heat-sink chip in thermal contact with the thermopile chip, according to an example.
Figure 12:
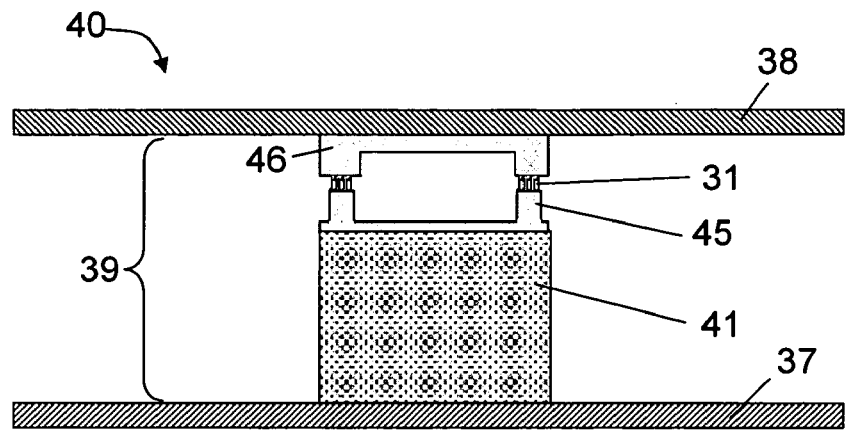
FIG. 12 is a side view of an assembly of a thermopile chip with two plates, according to an example.

The values for the TEG 40 are for the TEG illustrated in FIGS. 10 to 12 without additional improvements, such as a radiator. An additional advantage of the TEG 40 is that, by using a drastically reduced number of thermocouples 34 with respect to the TEG 20, the electrical resistance may be decreased by a factor of 300 and yield problems are much less severe. It is evident that a fabrication method for thermopiles 31 arranged as described above may provide the TEG 40 having a large voltage V (i.e., at least a value of 500 mV) and a large output power $P_{out}$ (i.e., at least a value of 1 μW) at the same time. Hence, the TEG 40 shows a V*$P_{out}$ product of at least 0.5 μWV.

An example configuration of the thermopile 31 is described hereinafter. However, it is to be understood that the thermopile 31 is not limited to this configuration. As already described above (see FIG. 7b), the thermopile chip 39 includes the thermopile 31 and at least one spacer 41a,b. The at least one spacer 41a,b is located at both sides of the thermopile 31, between the thermopile 31 and the hot plate 37, or between the thermopile 31 and the cold plate 38. Preferably, the spacer 41a,b has a height that is at least ten times larger than the height of the thermocouples 34 forming the thermopile 31.

A preferred configuration of a thermopile 31 is illustrated in FIG. 10a (cross-sectional view) and FIG. 10b (top view). It is desirable for the density of the thermocouples 34 per unit of surface of the spacer 41a, 41b to be as large as possible. It is also preferred that the thermocouple legs 35, 36 are normal to the surface 42 of a substrate 43 (i.e., in a direction substantially perpendicular to the plane of the substrate 43) or slightly inclined if limited by a processing requirement. An in-wafer-plane structure, such as thermopiles 34 on a membrane or free-standing in-plane bridges, is not as preferred as the vertical thermocouple legs 35, 36 depicted in FIG. 10a.

It is desirable for a contact surface 44 between semiconductor material with a dopant of a first type (e.g., p-type material) and semiconductor material with a dopant of a second type (e.g., n-type material) to be large in order to decrease the contact resistance to negligible values with respect to the thermocouple resistance. This is a limitation for further decreasing the surface 44 occupied by each thermocouple 34. Other factors which limit the minimal size of the surface 44 are technology, alignment accuracy, and topography. The increase of topography limits the resolution (or a minimal feature size), so h/a² might not increase.

The lateral size a of the thermocouple 34 should be as small as possible to increase the aspect ratio. Consequently, the thermal resistance $R_{th,tp}$ of thermopile 31 is limited by photolithographic technologies. Accordingly, the height of the thermocouples 34 should be as large as possible; however, the height is technologically limited as well.

When material properties of the thermoelectric material used to form the legs 35, 36 of the thermocouple 34, such as SiGe or BiTe, as well as the contact resistance are taken into account, an optimal area of about 30 μm² may be occupied by each thermocouple 34, if a minimal lithographic feature of 1 μm is considered. The optimal thickness of the legs 35, 36, at a resistivity of 1 mΩcm and with the height of the thermocouples 34 at 5 μm, varies from about 0.5 μm for BiTe to about 0.3 μm for SiGe.

The optimal number of thermocouples 34 is on the order of several thousands with the condition that a surface of 1 cm² is in contact with a heat source (e.g., a human body) and a heat sink (e.g., air). This means that the thermopile 31 may occupy a total surface of about 0.1 mm² as one thermocouple 34 could occupy 30 µm².

It may be extremely difficult to dice and handle such a small chip so as to align and assemble the chip with a heat-sink or heat-spreading chip placed on top, and to mount the assembly into a TEG 40. Thus, the thermopile chip 39 may be manufactured on a rim 45, as depicted in FIG. 11, before the thermopile chip 39 is 'sandwiched' between the hot plate 37 and the cold plate 38 (not shown in FIG. 11). The area of the top surface 45a of the rim 45 should be kept substantially equal to the total area of the thermocouples 34, on the order of 0.1 mm². The area of the thermopile chip 39 may be on the order of 4 to 20 mm².

In order to provide a good thermal contact of the top of thermocouples 34 to the cold plate 38, a second chip 46 (also called a heat-sink chip 46 or heat-spreading chip 46) is bonded to the top of the thermocouples 34. The bonding may be performed by reflowing a thin layer of metal (see FIG. 11) or with any other suitable process.

Mechanically, the thermopiles 31 are fragile due to the small leg cross-section. The thermopiles 31 may be protected when mounting the heat sink chip 46. The thermopiles 31 may be protected by not releasing the thermocouples 34 so that the presence of the sacrificial layer below makes the thermocouples 34 robust. Additionally and/or alternatively, the thermopiles 31 may be protected by manufacturing supplementary stoppers looking like micro-pillars with the same height as the thermocouples 34 on top of the rim 45. The maximal power and corresponding voltage, calculated for the structure illustrated in FIG. 11, are respectively 1 µW and 1 V for a SiGe thermopile, and 6.8 µW and 2.1 V for a BiTe thermopile.

For the hereinafter performed calculations, a thermocouple 34 with a height of 5 µm occupying an area of 30 µm² is used. Micromachined TEG devices produced by Infineon and referred above show an area of 267 µm² per thermocouple 34. The thermocouples 34 of the TEGs 40 occupy an area of about nine times less. Hence, the TEG 40 outperforms the micromachined TEG devices produced by Infineon. However, the TEG 40 is not limited by the dimensions in the above example.

The effect of increasing the aspect ratio h/a while keeping the same cross-section of the thermocouple 34 (i.e., while keeping "a" constant and the same chip area per thermo-couple 34, which is 30 µm² in the example given) has been analyzed. It has been found that an increase of the thermocouple height becomes less effective beyond 10 to 20 µm. For example, if the height of the legs 35, 36 is increased about 4 times, e.g. from 5 to 20 µm, the power increases by 60%, while further changing the height about 4 times, e.g. from 20 to 80 µm, gives only 20% increase of the power at the optimized number of thermocouples 34 in the thermopile 31.

The surface density of thermocouples 34 in the thermopile 31 plays an important role in obtaining maximal power and voltage from 1 cm² surface of a heat source. For example, an increase of the surface occupied by one thermocouple 34 from 5×6 µm² to 20×20 µm², causes a decrease in the output power by a coefficient of 5.

In FIG. 12, the thermopile chip 39 is placed in between a hot plate 37 and a cold plate 38. Furthermore, a spacer 41 may be provided in between the thermopile 31, positioned on/under a raised elongate structure or rim 45 in accordance with FIG. 11, and the hot plate 37. By changing the features of the spacer 41, for example by making this spacer 41 higher (i.e., by increasing the distance between the cold plate 38 and the hot plate 37), a further increase of the output power and output voltage may be obtained. For example, an output power of 11.8 µW and an output voltage of 2.1 V may be obtained in the example of BiTe legs 35, 36 and a total spacer height of 5 mm (i.e., the height of the spacer 41 plus chips 45, 46 that serve as a part of the spacer 41 as well). The distance between the cold plate 38 and the hot plate 37 may be varied in a wide range.

It is to be understood that the TEG configuration as illustrated in FIG. 12 is not limiting. For example, a spacer may be provided in between the thermopile 31 and the cold plate 38 instead of in between the thermopile 31 and the hot plate 37. As another example, spacers may be provided both in between the thermopile 31 and the hot plate 37 and in between the thermopile 31 and the cold plate 38.

Additionally, the position of the raised elongate structure or rim 45, forming the first chip, and the second chip or heat-sink top chip 46 may be reversed (i.e., the rim 45 may be positioned between the hot plate 37 and the thermopile 31, while the second chip or heat-sink top chip 46 may be positioned between the thermopile 31 and the cold plate 38). Moreover, in another embodiment, the chips 45, 46 may be placed between the hot plate 37 and/or the cold plate 38 and the spacer 41. The functions of the spacer 41 in FIG. 12 may actually be distributed between the spacer 41, the rim 45, and the heat-sink or heat-spreading chip 46, which serves as a part of spacer 41 as well.

By increasing the height of the spacer 41, the FOMs may be improved. For example, for a spacer height of 5 mm, and the other conditions being the same as described at the start of the description, the FOMs may be: $FOM_1 = 27$ µW V, $FOM_2 = 3 \times 10^{-2}$ µm$^{-1}$, and $FOM_3 = 0.8$ V W/m.

The performance of the TEG 40 may be enhanced in several ways. For example, the TEG 40 may be enhanced: (i) by positioning large-size radiators 48 on the cold plate 38, like radiators used for cooling electronic components, (ii) by increasing the contact area of the TEG 40 with the heat source, (iii) by appropriately choosing materials and design in order to improve thermal isolation between the hot plate 37 and the cold plate 38, (iv) by increasing heat flow, or (v) by adapting the TEG 40 to the ambient conditions. These possibilities to enhance the performance of the TEG 40 are discussed for a TEG 40 attached to a wrist of a person with a watch strap. However, this wrist application is provided as a non-limiting example.

At normal temperature and pressure (e.g., at a temperature of about 20° C. and a pressure of about 100 kPa) and in still air, the thermal resistance $R_{th,air}$ at the cold plate 38 of the TEG 40 depicted in FIG. 12 is a few times larger than the thermal resistance occurring inside a human body $R_{th,body}$. By increasing the contact area between the cold plate 38 and air, the heat flow from the body can be improved. For example, the contact area between the cold plate 38 and air may be increased by increasing the area of the cold plate 38 or by coupling a radiator 48 to the cold plate 38.

Figure 13:
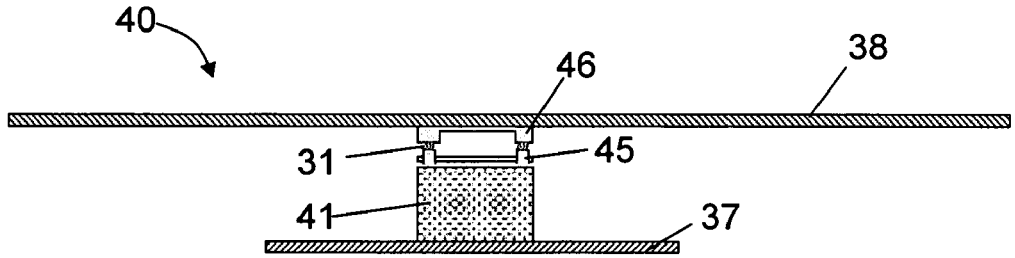
FIG. 13 is a side view of an assembly of a TEG and a pillar with a radiator, according to an example.

In FIG. 13, the cold plate 38 has a larger area with respect to the TEG 40 depicted in FIG. 12, while the area of the hot plate 37 is fixed to 1 cm² (same area as in FIG. 12). For simplicity, the width of the cold plate 38 has been kept the same and hence, only the length of the cold plate 38 is increased. A side view of this TEG is shown in FIG. 13.

Figure 14:
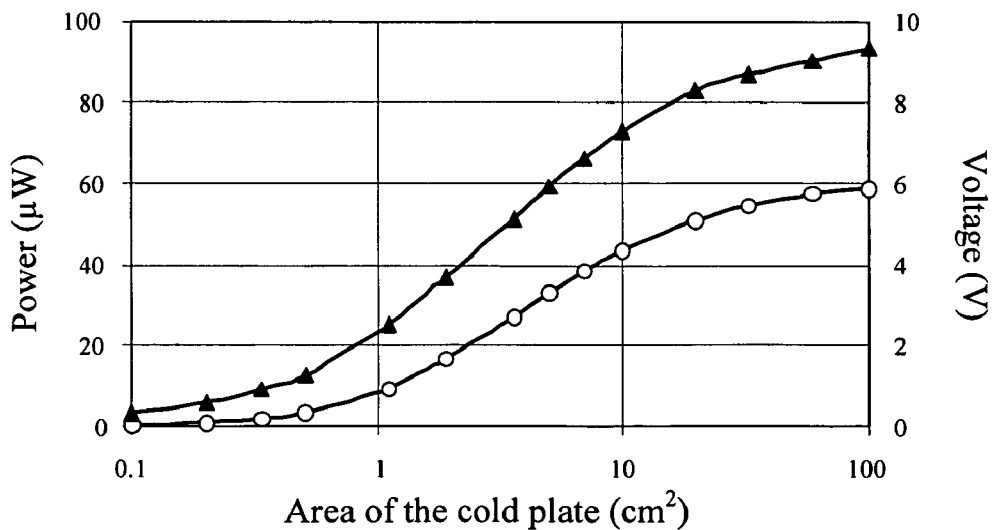
FIG. 14 is a graph depicting power (○) and voltage (▲) at an optimal number of thermocouples versus the area of the cold plate.

FIG. 14 shows power (○) and voltage (▲) as a function of the area of the cold plate 38 for the TEG 40 as shown in FIG. 13. Calculations have been performed by assuming that the cold plate 38 of the TEG 40 in FIG. 12 has the same heat transfer coefficient per unit length as the cold plate 38 of the TEG 40 in FIG. 13. An improvement of the generated power and voltage may be achieved by matching the heat transfer coefficients of the hot plate 37 and cold plate 38 (i.e., by making them of unequal size). The most rapid change of power and voltage occurs when $R_{th,body} \approx R_{th,air}$. The power and voltage strongly depend on the size of the cold plate 38 only if this size is below 10 to 20 cm² (see FIG. 14). This is the typical surface occupied by a watch or by a watch and bracelet.

In real conditions of use, the air is not perfectly still, as was assumed in the above considerations. The air moves for different reasons, such as air conditioning, natural convection inside buildings, wind outside, and the movement of humans. This brings about a decrease of the optimal ratio of the cold plate area to the area of the hot plate 37, which can be estimated in the range of 1-10, depending on particular applications of the TEG 40. This means that, for the TEG 40, surface dimensions will vary from those of a watch to those of a watch plus bracelet (watch strap).

Figure 15A:
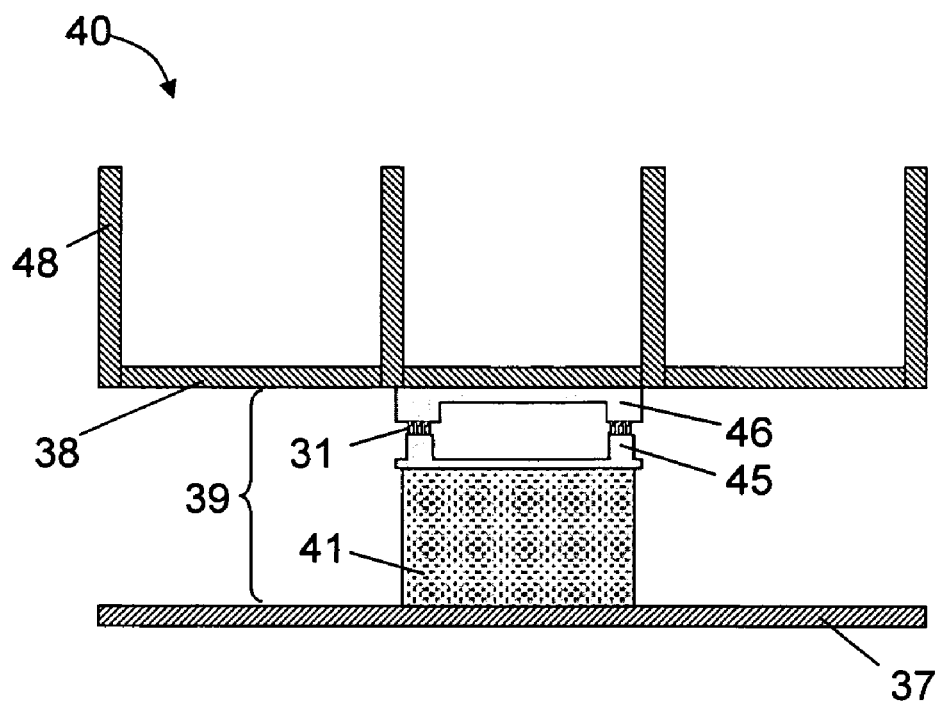
FIG. 15a is a cross-sectional view of the assembly of a thermopile with a radiator, according to an example.
Figure 15B:
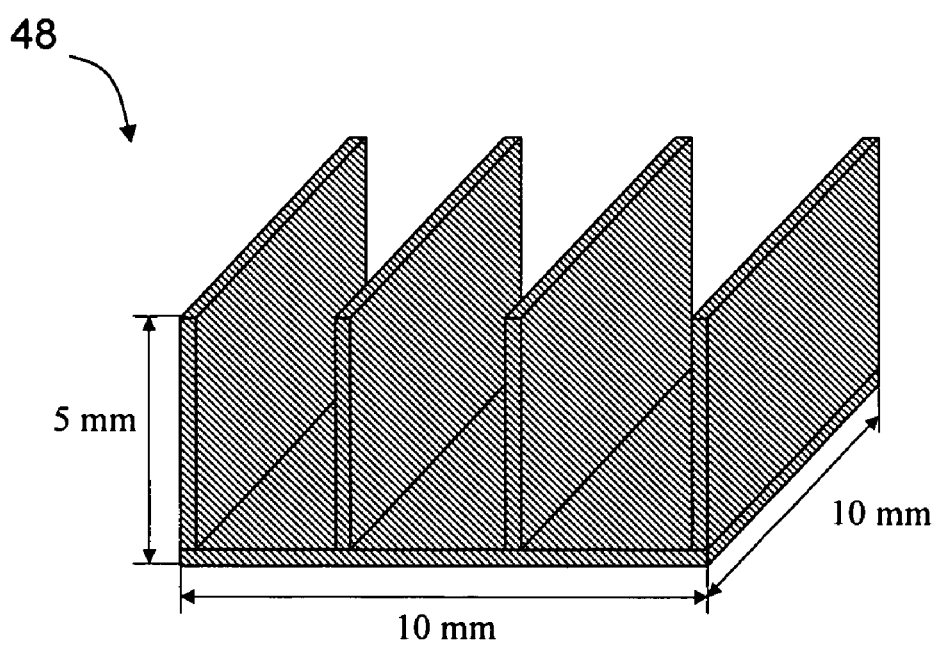
FIG. 15b is a perspective view of the radiator depicted in FIG. 15a, according to an example.

Since a thickness in the order of 1 cm can easily be accepted for a TEG 40, it is possible to mount a radiator 48 onto the cold plate 38 as shown in FIG. 15*a*. This will reduce the surface of the TEG 40. In FIG. 15*a*, a "classical" shape is used for the radiator 48 for simplicity of calculations (see FIG. 15*b* for a perspective view and dimension details). The actual shape may be different, especially for applications on a human body. The radiator 48 may be manufactured in any suitable shape, taking into account its performance, but also its attractive view, cost of manufacturing, different possible applications, and related aspects.

Figure 16A:
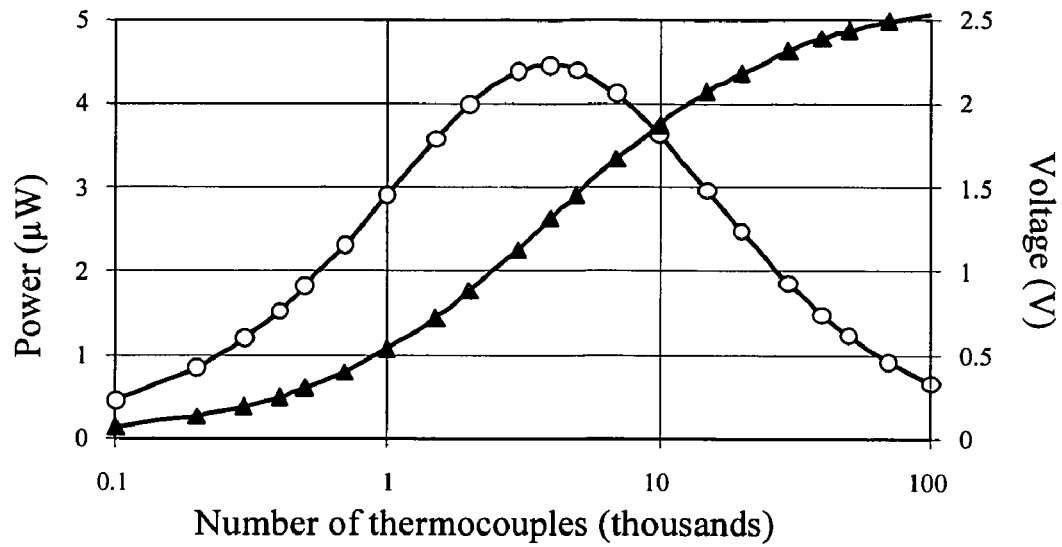
FIG. 16a is a graph depicting power (○) and voltage (▲) generated by a 0.5×1×5 µm³ thermopile at a contact resistance of 120 Ω/cm² for a SiGe thermopile.
Figure 16B:
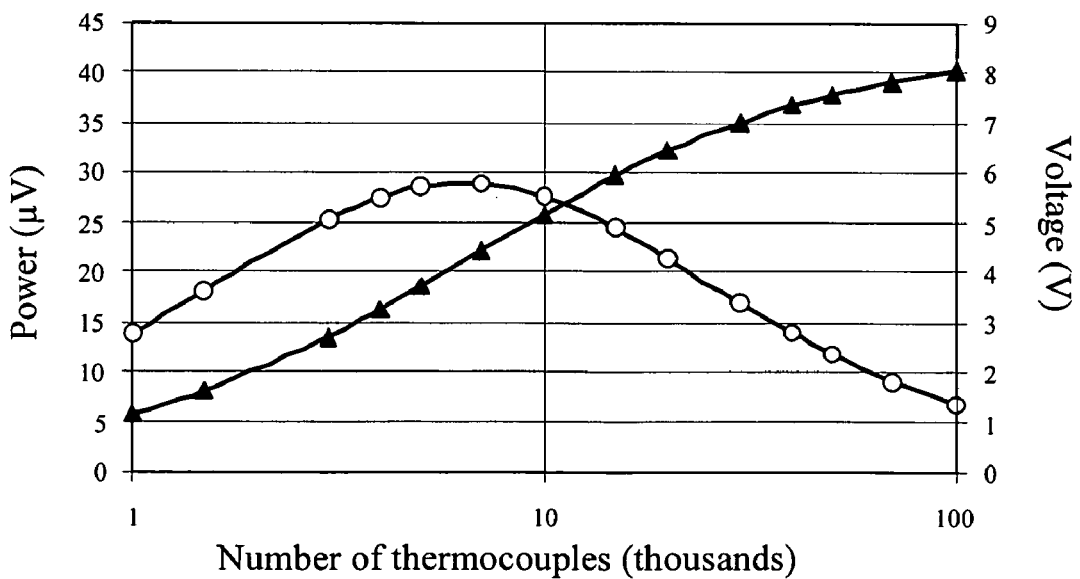
FIG. 16b is a graph depicting power (○) and voltage (▲) generated by a 0.5×1×5 µm³ thermopile at a contact resistance of 120 Ω/cm² for a BiTe thermopile.

In FIG. 16, the performance of the TEG 40 as illustrated in FIG. 15 is graphed. FIG. 16*a* shows the power (○) and voltage (▲) as a function of the number n of thermocouples 34 in case of a BiTe thermopile. FIG. 16*b* shows the power (○) and voltage (▲) as a function of the number n of thermocouples for a SiGe thermopile. In both cases, the height of the spacer 41 is 5 mm and the total thickness of the device is 10.5 mm, similar to the thickness of a watch. Calculations have been performed assuming a contact electrical resistance of 120 $\Omega\mu m^2$ between the interconnecting metal and the thermoelectric material (e.g., BiTe or SiGe) with resistivity of 1 m$\Omega$ cm, a thermal conductivity of 1.5 W/mK for BiTe, and a thermal conductivity of 3 W/m K for SiGe. The hot plate area is 1 cm² and the heat flow is 18.5 mW/cm². It is noticed that the introduction of the radiator 48 significantly increases the power and the voltage by a factor of about 2.

The use of a radiator 48 further improves the FOMs. For example, at a spacer height of 5 mm, radiator height of 5 mm, and the other conditions being the same as specified in the beginning of the description, the FOMs become: $FOM_1$=90 $\mu$W V, $FOM_2$=4.9×10$^{-2}$ $\mu m^{-1}$, and $FOM_3$=4.5 V W/m.

If the thermal resistance of the cold plate 38 is made low enough as described above, it may be possible to obtain an even better voltage and power generation by increasing the area of the hot plate 37. However, the total area occupied by the TEG 40 for human body applications is limited. Furthermore, the reaction of human beings to the TEG 40 must be taken into account. People easily accept a 1 cm² TEG, which absorbs approximately 18.5 mW/cm², but may not accept a 10 cm² TEG with the same (or even lower) heat flow per unit surface. This acceptance is related to the physical reaction of their bodies to a local decrease of skin temperature as well as to a psychological reaction to an unusual (cold) device. If either the low temperature area or the heat flow per 1 cm² are small, the TEG 40 does not disturb its users.

Another way to improve the TEG 40 performance acting on the hot plate 37 may be by structuring a set (pattern) of bumps or miniature needles onto it. These bumps or miniature needles will press or punch the skin partially and locally to decrease (i) the body thermal resistance by decreasing the heat path length in the body, and (ii) the interface thermal resistance by improving local pressure to a skin and increasing the contact surface between the skin and the hot plate 37 at the same size of a hot plate 37.

The thermocouples 34 forming the thermopiles 31 may be distributed in different configurations. The thermocouples each have a footprint with a base area (i.e., the area they occupy). Preferably, the thermocouples 31 are distributed on a raised continuous elongate structure over an area of the hot plate 37 (or the cold plate 38) in which the area of the hot plate is substantially larger than the total base area of the thermocouples 31 (i.e., the accumulated base area of all thermocouples 31 together).

Figure 17:
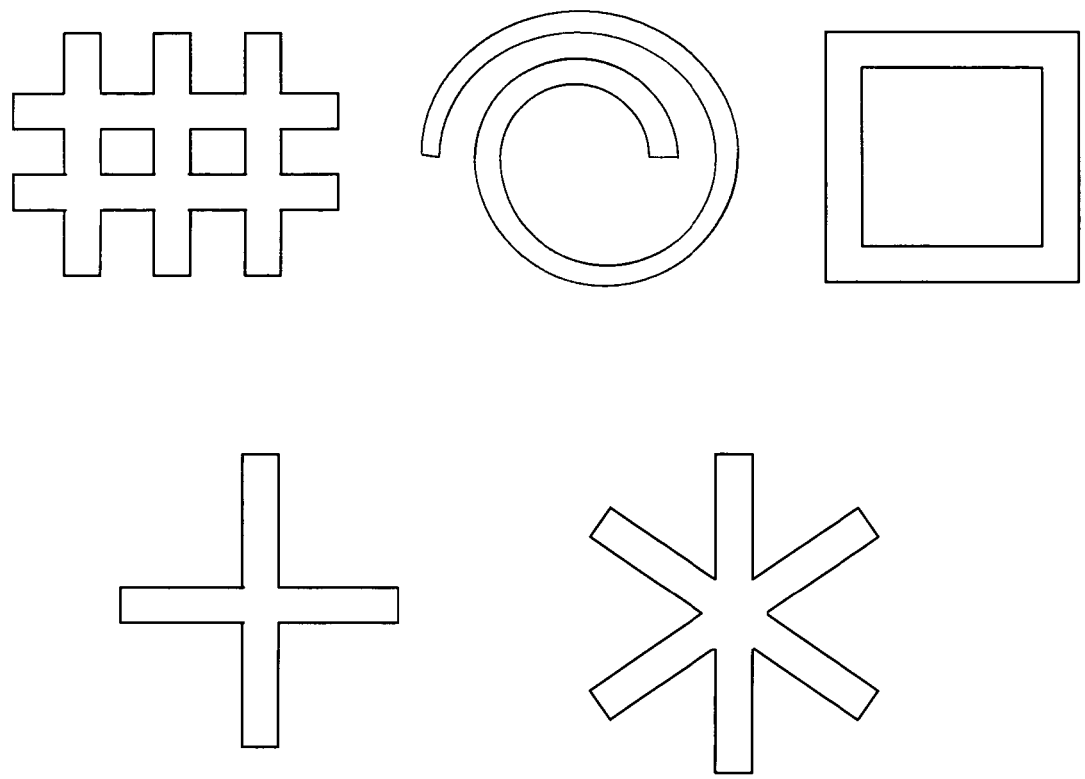
FIG. 17 is a pictorial representation of examples of distributed thermopiles in a continuous laterally elongate structure, according to an example.

Different thermocouple configurations are illustrated in FIG. 17. FIG. 17 shows some possibilities for the distribution of thermocouples 31 according to a preferred continuous laterally elongate structure. An elongate structure has a length and a width, the length having a dimension that is larger than the dimension of the width. Other distribution configurations for the thermocouples are also possible.

When the thermocouples 34 are distributed between the hot plate 37 and the cold plate 38 as described above, a high thermal current may flow through the thermocouples 34 and a high output power of at least 1 $\mu$W may be achieved. Furthermore, by applying the above thermocouple distribution on a laterally elongate structure, and because of the air in between two neighboring thermocouples 31 positioned in between the hot plate 37 and the cold plate 38, a large temperature drop may be achieved. Hence, a high output voltage of at least 0.5V may be obtained.

The TEG 40 shows a high output voltage V and a high output power $P_{out}$, and hence shows a high V*$P_{out}$ product of at least 0.5 $\mu$W V. This is in contrast with the other TEG devices, which show either a high output voltage combined with a low output power or a low output voltage combined with a high output power.

Figure 18:
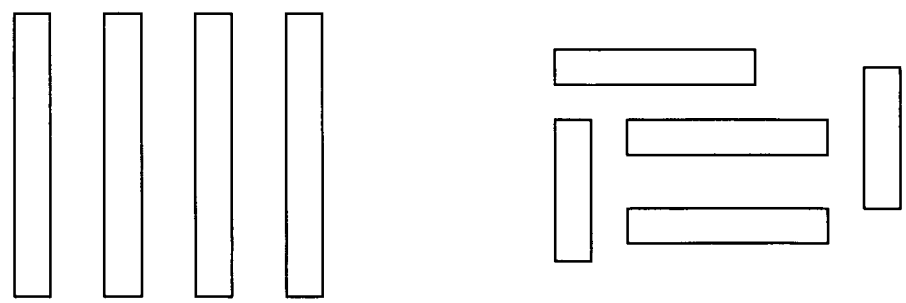
FIG. 18 is a pictorial representation of examples of distributed thermopiles in a discontinuous laterally elongate structure, according to an example.

Other configurations for the distribution of thermocouples 34 over the area of the hot plate 37 (or cold plate 38) are illustrated in FIGS. 18 and 19. FIG. 18 shows a discontinuous laterally elongate structure, while FIG. 19 shows a completely discontinuous distribution. These two possible distribution configurations are less preferred than the distribution configurations depicted in FIG. 17 because they show interruptions between neighboring thermopiles 31. The more interruptions that exist between neighboring thermopiles 31, the more additional connections that have to be made to connect the neighboring thermopiles 31.

A shock-protecting structure 49 and/or a touch-protecting structure 50 may be added to the TEG 40. The touch-protecting structure 50 is used to avoid occasional contact of warm parts of the body with the cold plate 38. The structures 49 and 50 may preferably be fabricated from thermal isolator materials, such as plastics. However, suitable metals, semiconductors, and natural materials with low thermal conductivity may be used as well.

Figure 20:
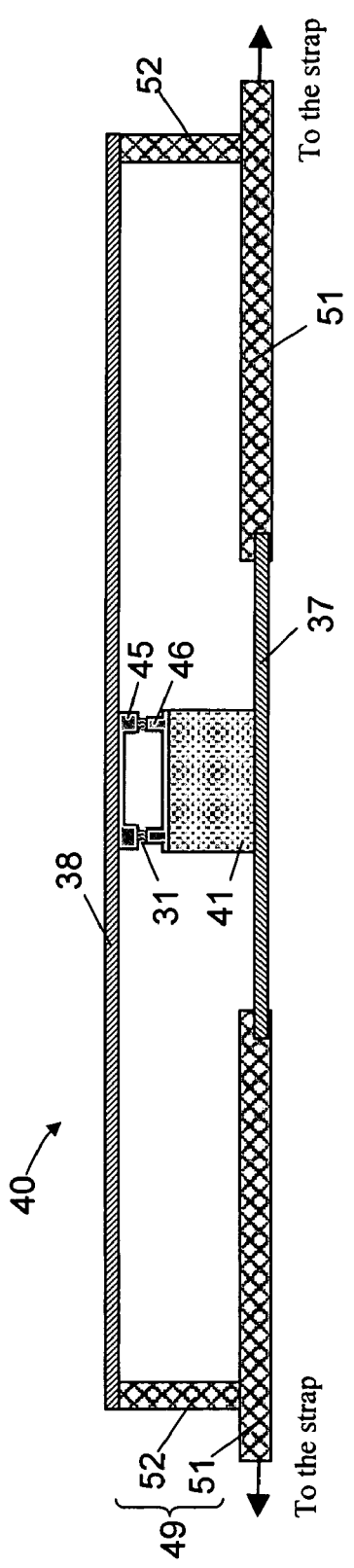
FIG. 20 is a cross-sectional view of a TEG, according to an example.

A cross section of a TEG 40 that includes a shock-protecting structure 49 is illustrated in FIG. 20. The shock-protecting structure 49 may be formed by a thermally isolating plate 51 and by pillars 52 connecting the thermally isolating plate 51 to the cold plate 38. The isolating plate 51 and the pillars 52 may be composed of plastic. Instead of pillars 52, a sidewall made of material with a low thermal conductivity may be used for a complete sealing of the TEG 40. However, the thermal conductance of these sidewalls may not significantly affect the thermal properties of the TEG 40. The sidewalls may include a set of openings or holes, which are for air convection in the TEG 40 and to decrease the heat conduction through the sidewalls from the hot plate 37 to the cold plate 38.

Figure 21:
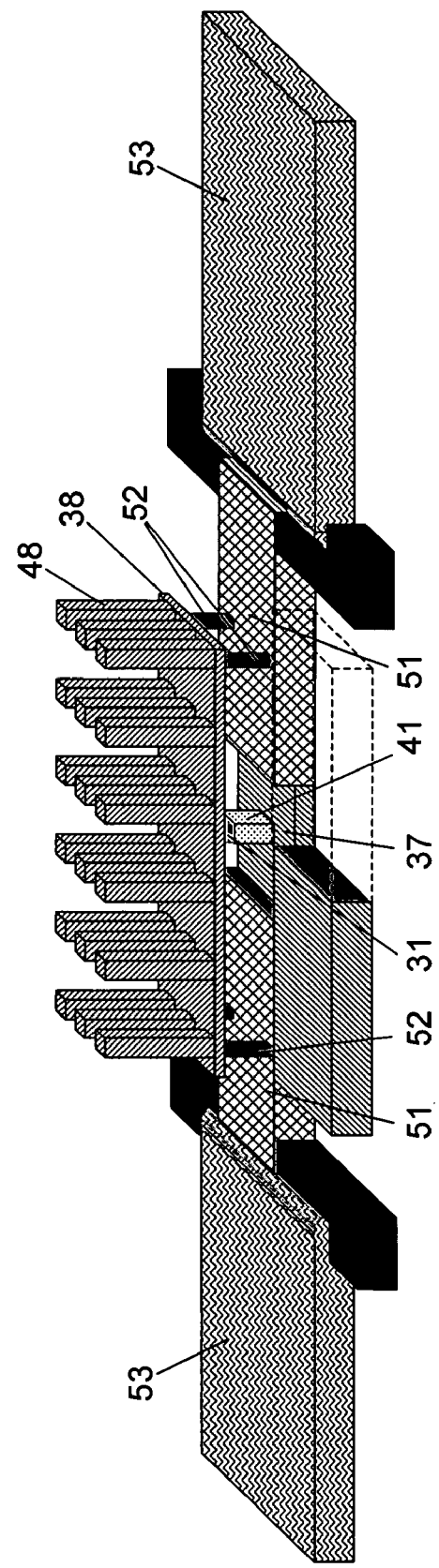
FIG. 21 is a perspective view of the TEG depicted in FIG. 20 attached to a watchstrap and with a radiator, according to an example.

Another possible configuration of a shock-protecting structure 49 may include another type of radiator 48 and is shown in FIG. 21. The TEG 40 may be attached to a watchstrap 53.

The shock-protecting structure 49 may be shaped in such a way that it improves heat transfer from the body to the TEG 40, as shown in FIG. 22. The thermally isolating plate 51 may include a hole 54. The hole 54 in the thermally isolating plate 51 may be located adjacent to spacer 41 such that the hot plate 37 is below a bottom surface of the thermally isolating plate 51 (as shown in FIG. 22), providing better pressing of the hot plate 37 to the skin and less heat transfer to the thermally isolating plate 51.

The TEG 40 may also include a touch-protecting structure 50. The touch-protecting structure 50 may protect the radiator 48 of the TEG device 40 from occasionally being touched by, for example, fingers, A TEG 40 comprising a touch-protecting structure 50 is shown in FIG. 23. The touch-protecting structure 50 is preferably not preventing or disturbing to both the air flow and the radiation from the hot plate 37. The touch-protecting structure 50 may be a grid-type structure with large openings, as can be seen in FIG. 23.

In the example given in FIG. 23, the TEG 40 still comprises a shock-protecting structure 49 in the form of a thermally isolating plate 51 and pillars 52 as illustrated in FIGS. 20 and 21. However, in some particular cases, the touch-protecting structure 50 may serve simultaneously as a shock-protecting structure. In those cases, the heat isolating supports, i.e., the pillars 52 in FIGS. 21 and 22, are not necessary anymore if the particular attachment of the radiator 48 to the thermopile assembly properly holds the radiator 48. The touch-protecting structure 50 should not significantly affect the heat transfer from the radiator 48 to outside of the TEG 40. This may be controlled by providing enough holes in the touch-protecting structure 50. If the path for heated air is blocked or the output of infrared radiation is prevented, the TEG device 40 may be less effective.

Furthermore, the performance of the TEG 40 may be improved as a result of improvements related to appropriate choice of materials and design for forming the TEG 40 and of the use in specified circumstances.

To prevent or suppress the radiation heat exchange inside the TEG 40, the inner surfaces of the TEG 40 may have low emissivity in the infrared region of the electromagnetic spectrum. For example, a number of metals may serve as low-emissivity materials. Thus, if plastics or other materials used for forming the TEG 40 have large emissivity, these materials preferably are covered with highly reflecting (low emissivity) material, such as a metal.

To the contrary, the heat exchange from the outer surface of the TEG 40 to the environment should be increased. Therefore, for the outer parts of the TEG 40, materials or coatings may have high emissivity in infrared region, where the heat exchange occurs at room temperatures, which is a particular case of an application of the device.

For better thermal isolation of the cold plate 38 and/or the radiator 48 from the warmer parts of the TEG 40 and a heat source, the inner volume of the TEG 40 as well as the volume on/in between the chips 45, 46, may be filled with a material showing lower thermal conductivity than the air, such as a microporous material.

Figure 24:
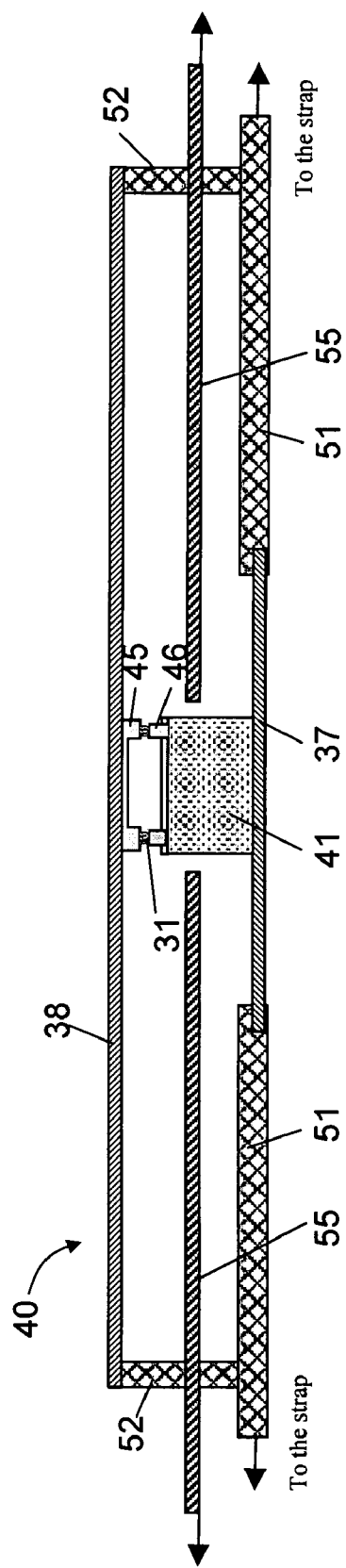
FIG. 24 is a cross-sectional view of a TEG, according to another example.

In order to minimize the parasitic thermal conductance inside the TEG 40 between the hot plate 37 and the cold plate 38, a shield or screen 55 may be installed in between and thermally isolated from the hot plate 37 and the cold plate 38. This is illustrated in FIG. 24. The parasitic heat coming to the shield or screen 55 is dissipated outside the TEG device 40.

Figure 25:
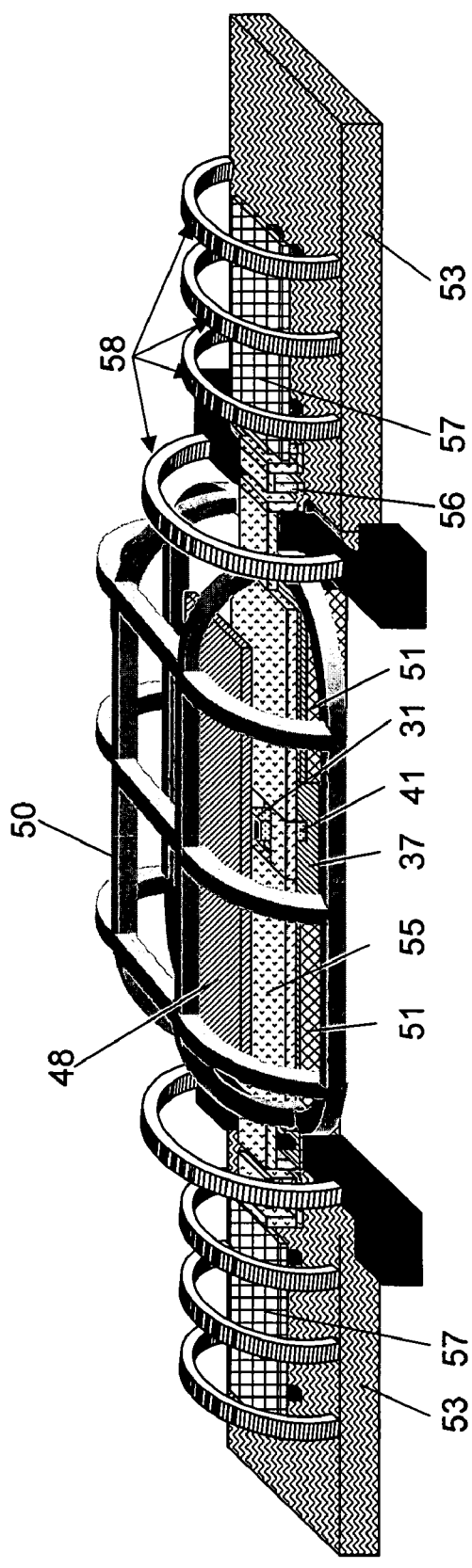
FIG. 25 is a perspective view of the TEG depicted in FIG. 24 attached to a watchstrap, according to an example.

FIG. 25 shows in perspective view the TEG 40 depicted in FIG. 24 attached to a watchstrap 53. The cooling part of the screen 55 may be placed above the watchstrap 53. FIG. 25 illustrates the screen 55 installed on thermally isolating pillars 52 above the watchstrap. The TEG 40 may be protected by a touch-protecting structure 50 and may be isolated from the watchstrap 53 by thermally isolating pillars 52. The screen 55 may include a flexible part 56 for bending the screen 55, for example, when the watchstrap 53 is worn. The TEG 40 may also include radiating plates 57 on the screen 55 and a shock- and touch-protecting structure 58 for the screen 55. The TEG 40 may also include a flat radiator 48. However, other shaped radiators 48 may also be used. Instead of the pillars 52, a sheet of a material with low thermal conductivity could be used, possibly provided with holes.

By providing dissipation of the heat from the shield or screen 55 to the air, a screen temperature equal to or close to the temperature of the cold plate 38 may be reached, thereby practically eliminating parasitic heat flow from the hot plate 37 to the cold plate 38. The shield or screen 55 may canalize the heated air coming from the surrounding skin surface in between the shield 55 and the hot plate 37, protecting the cold plate 38 from parasitic heating by the incoming heated air.

As the TEG 40 may be used for outdoor applications, different precautions may be taken in order to prevent influence of external factors. One precaution may be to make the outer surfaces of the TEG 40 reflective to prevent the absorption of sunlight followed by the undesired heating of the cooling surfaces. Additionally, spectrally selective surfaces may be formed with maximal efficiency of radiation of thermal radiation of about 300 K effective blackbody temperature, and reflecting the visible, near-infrared, and mid-wave infrared power from the sunlight, including the reflected/scattered light.

Another precaution may be based on the knowledge that at constant direct sunlight, the temperature of the hot side could exceed the skin temperature. In this case, by making outer surfaces absorb the sunlight, the TEG 40 may be used in a reverse mode of operation (i.e., when the heat flow direction is from the radiator to a body, or to another surface, on which the device is mounted). Simple electronic methods exist to rectify such change in polarity of the voltage and to obtain the voltage of fixed polarity.

Figure 26:
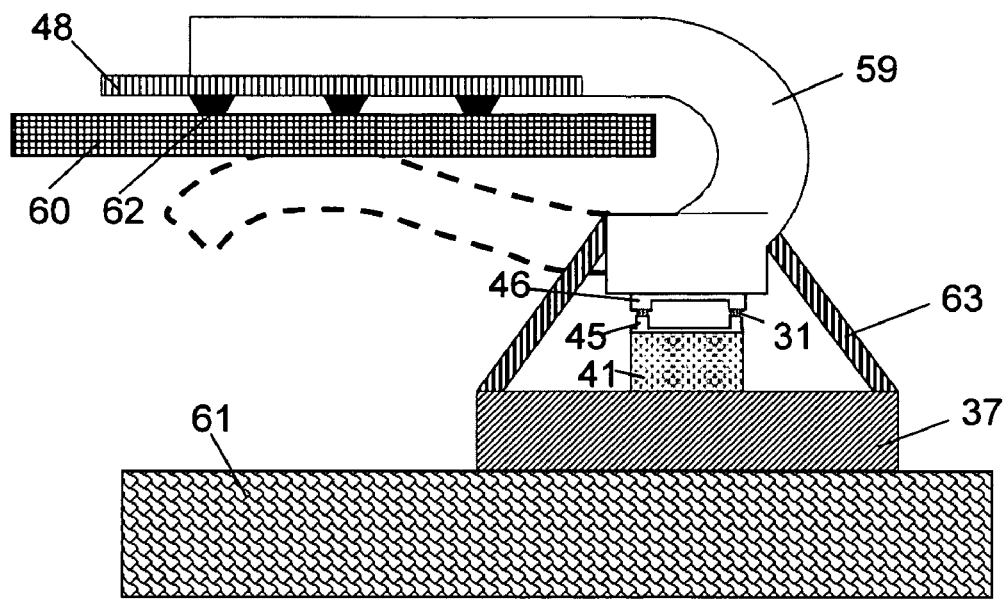
FIG. 26 is a cross-sectional view of a TEG mounted on a clamp and attached to a sleeve on a wrist, according to an example.

FIG. 26 shows a cross section of a possible implementation of the TEG 40. The TEG 40 may be mounted on a clamp 59 and may then be attached to a sleeve 60 of clothing that a human body is wearing, such that the hot plate 37 of the TEG 40 is in contact with the wrist of that human body. As can be seen from FIG. 26, the hot plate 37 is in contact with the skin 61 and is positioned in between the skin 61 and the sleeve 60.

The principle of the design of the TEG 40 for application on a human body is related to the fact that the sleeve 60, and thus the clothing, is designed such that it decreases the heat dissipation from the body. Therefore, the TEG 40 placed under the clothing may perform worse than in the case of an 'open', not covered, skin 61 and/or radiator 48 surface. This is important, especially for wrist applications, since in most cases the cloth has sleeves 60 that prevent effective heat dissipation into the air, if the sleeve 60 covers the TEG 40 on a wrist. Therefore, the clamp type device, illustrated in FIG. 26, may be used in this case.

Depending on the material properties of the clothing and the conditions of the application, the TEG 40 may comprise heat-isolating pads 62 providing direct contact of the radiator 48 to the cloth. The cloth will serve in this case as an additional radiator. The cloth may be layered, and should have low thermal conductance for its inner layers, and high thermal conductance for the outer layers (surface) of the cloth. For example, metal threads could be included into the outer layer of the cloth material, such as cotton. The TEG 40 may also include shock-protecting pillars or side walls 63.

Figure 27:
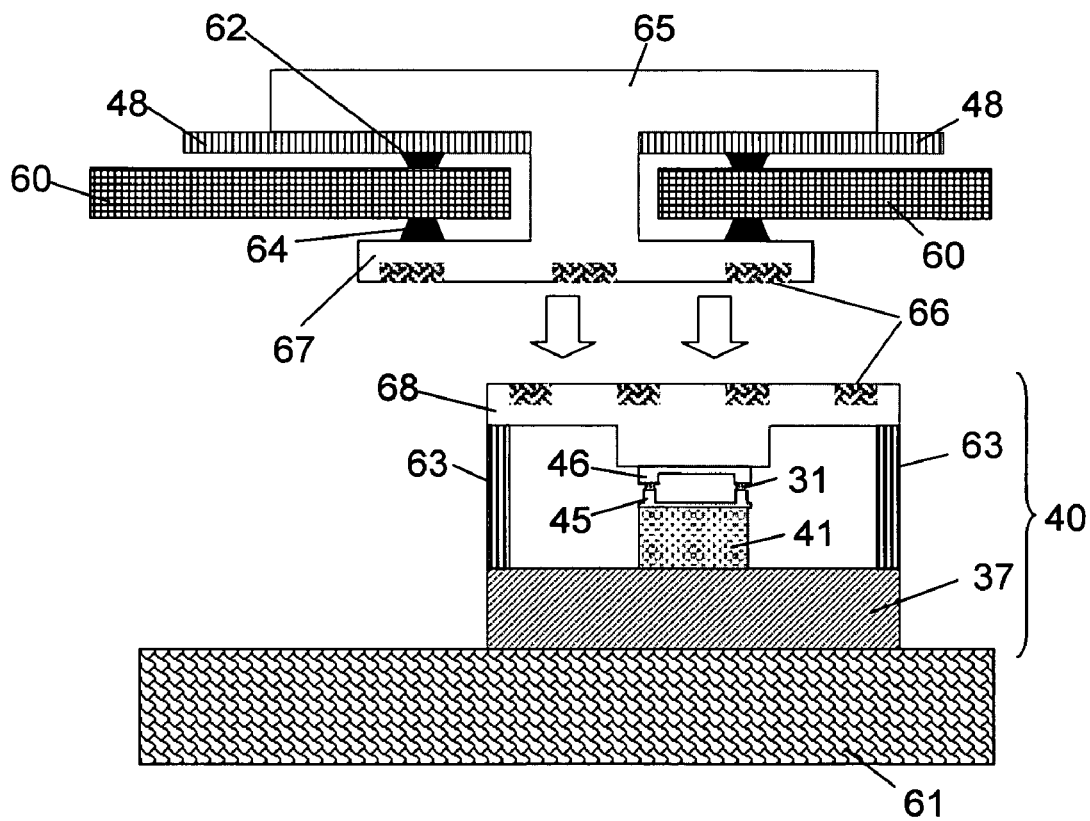
FIG. 27 is a cross-sectional view of a TEG with a magnetic clamp, according to an example.

To improve the thermal conductance of the TEG 40 on a cloth, heat-transferring buttons 64 could be made on the sleeve 60 as depicted in FIG. 27. One or more buttons 64 may provide reliable temporary thermal attachment to the TEG 40 while wearing the above cloth. Of course, the layered cloth described above could be used as well. In that case, the isolating pads 62 are not required on the outer surface of the cloth, and a good thermal contact is desirable between the outer surface and the radiator 48.

FIG. 27 shows a cross section of the TEG 40, positioned on a wrist with a magnetic clamp 65. The TEG 40 may be attached to the skin 61, for example, with a band-aid (not shown). The separate radiator 48 may be mounted on the cloth. The attachment to the cloth, such as the sleeve 60, may be provided with small magnets 66 on two plates 67, 68. One of the plates, plate 67, may be connected to a metallic button on the sleeve 60, while the other plate, plate 68, may be on the heat-spreading plate 46 of the TEG 40. In one embodiment, these plates 67, 68 may be replaced with a ferromagnetic material. The quantity, size, and spacing of the buttons 64 on the cloth are designed to contact the TEG 40.

In the above described embodiments, the TEG 40 is suggested as being connected to the skin 61 of a person through the hot plate 37. However, the hot plate 37 and the cold plate 38 may be reversed. The TEG 40 may then be configured such that the cold plate 38 is in contact with the skin 61. For example, on a hot day the TEG 40 surface may be heated and the TEG 40 may work with the cold plate 38 attached to the skin 61 of a person.

The TEG 40, if used on a body of a warm-blooded animal, should be placed on the body relative to the positions of arteries 69. In particular, the TEG 40 should be place on the body where an artery 69 comes close to a skin surface 70. For wrist applications, the positioning of the TEG 40 on the usual place for a watch 71, as illustrated in FIG. 28a, is not the best location. Significantly better results may be obtained if the TEG 40 is positioned at the place as shown in FIG. 28b. In FIGS. 28a and b, reference number 72 refers to bones of the human body.

Depending on thermal resistance of the radiator 48 used, a dramatic decrease of the equivalent thermal resistance of the body could be obtained, up to about 50% (depends on a particular person). In experiments, up to 50% increase of the heat flow produced by a human body has been observed, increasing of the obtainable power per unit surface of the body up to two times. Moreover, people are less sensitive to the TEG 40 actively absorbing a body heat if the TEG 40 is placed as shown in FIG. 28b, as compared with the TEG 40 being placed in the watch position depicted in FIG. 27a. When the TEG 40 is placed in the watch position, people frequently complain that the TEG 40 is too cold even if less heat flow is being taken from the body.

Returning to the FOMs, at the spacer height of 5 mm and radiator height of 5 mm, and at conditions as specified in the beginning of the description, except for the thermal resistance of the body which decreases to 200 cm$^2$ K/W, the FOMs improve to: $FOM_1$=145 μW V, $FOM_2$=5.4×10$^{-2}$ μm$^{-1}$, and $FOM_3$=7.9 V W/m.

In table III, a summary of FOM values for different embodiments is provided.

TABLE III

Comparative Figures of Merit for different embodiments

| TEG according to different embodiments of the invention comprising: | FOMs for a TEG with 1 cm2 contact area between the TEG and the skin of a human being | | |
|---|---|---|---|
| | $FOM_1$ (μW V) | $FOM_2$ (μm$^{-1}$) | $FOM_3$ (W V/m) |
| a distance between the hot 37 and cold 38 plate of 1.5 mm | 16.7 | 2.6 × 10$^{-2}$ | 0.44 |
| a distance between the hot 37 and cold 38 plate of 5 mm | 27 | 3 × 10$^{-2}$ | 0.8 |
| a distance between the hot 37 and cold 38 plate of 5 mm, and a radiator 48 on the cold plate 38 | 90 | 4.9 × 10$^{-2}$ | 4.5 |
| a distance between the hot 37 and cold 38 plate of 5 mm, a radiator 48 on the cold plate 38 and positioned near artery 69 | 145 | 5.4 × 10$^{-2}$ | 7.9 |

The TEG 40 fabrication is described generally with the following three steps. First, the fabrication of the thermopiles 31 is performed on a planar substrate using deposition (e.g., chemical vapor deposition (CVD) or other suitable deposition techniques), lithography, and etching of various layers. Next, deep etching of the substrate is performed in order to fabricate a rim 45. Then the cold plate 38 is fabricated and mounted over the thermopile chip 39. A more detailed description is provided as follows.

In a beginning step of the manufacturing of the TEG 40, the thermopiles 31 are formed. Although the fabrication principle is the same for different materials, fabrication details may depend on the thermoelectric material used for forming the thermocouples 34. As an example, fabrication processes are described for thermopiles 31 comprising SiGe thermocouples and thermopiles 31 comprising BiTe thermocouples. In case SiGe is used as thermoelectric material, the process may be easily adapted to Si or similar materials. In the case of BiTe, the process can be easily adapted to SbTe, SbBiTe, and similar materials. The principle of the fabrication process may be more generally applied to other thermoelectric materials, such as skutterudites, nanostructured materials, and so on. The principle of the fabrication process may further be extended to materials with similar chemical properties.

Firstly, a fabrication process will be described for a TEG 40 comprising thermopiles 31 comprising SiGe. This fabrication process is illustrated in FIG. 29a to FIG. 29l. On a thermally conductive substrate 80, an electrically insulating material 81 is deposited. The substrate 80 may preferably comprise Si, but may also comprise any other suitable thermally conductive material, such as AlN, Cu, or others, and may have a thickness of between, for example, 600 and 800 μm. The insulating layer may be SiN. The layer of electrically insulating material 81 may have any suitable thickness, depending on the kind of electrically insulating material 81 used and the quality thereof. Furthermore, the thickness of the layer of electrically insulating material 81 is preferably chosen such that the material 81 has a compact structure, without pin holes, which could produce short circuits.

Next, a series of trenches 82 are formed. This may be performed by means of lithographic methods. The trenches 82 may have a depth d, which should be as deep as possible (e.g., 2.5 μm) in order to minimize the parasitic thermal conduction through air. In one embodiment, the trenches 82 may be as deep as the height of the raised elongate structure or rim 45. This corresponds to the situation where the rim 45 is only present underneath the legs 35, 36 of the thermocouple 34. In this case, the output power increases by approximately 25% with respect to a 2.5 μm trench. If, in another embodiment, the depth of the trenches 82 is zero, i.e., no trenches 82 are present, the power generated by the TEG 40 may decrease by 20%.

The trenches 82 may have a width $w_1$, which may, for example, be 8 μm. As the purpose of the invention is to fabricate a large number of thermopiles 31 in an area as small as possible, $w_1$ should be as small as possible. However, the limit of $w_1$ is determined by the lithographic technology. Different layers are used to build onto $w_1$ (see further in FIG. 29i), which have to be aligned to each other. Above the trenches 82, both the number of layers and the tolerances of the lithographic process contribute to the definition of $w_1$. The size of $w_2$ may depend on the same principles. This process is illustrated in FIGS. 29a and 29b, which respectively show a cross section and a top view of the structure so far obtained.

Figure 29C:
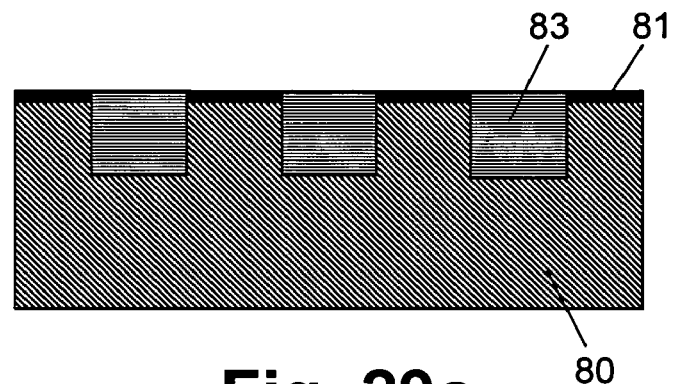
Figure 29D:
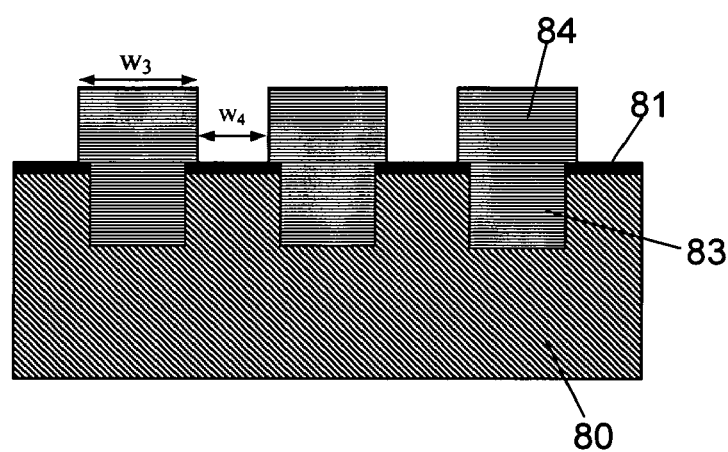
Figure 29E:
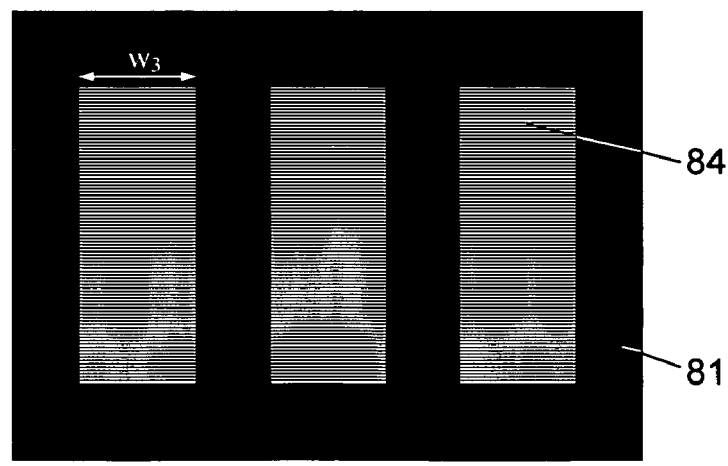

Next, a first layer of insulating sacrificial material 83, which may, for example, be $SiO_2$, is deposited on top of the structure as shown in FIG. 29a and is then planarized. The result is illustrated in FIG. 29c. Then, a second layer of the same sacrificial material is deposited and patterned as shown in FIG. 29d (cross section) and FIG. 29e (top view). After the second layer with sacrificial material has been patterned, blocks 84 are obtained with a width $w_3$, which may for example be 12 μm. The width $w_3$ may be larger than $w_1$ so as to allow for alignment errors of photolithographic masks and process accuracy. The height of the blocks 84 may be determined by the height of the spacers 41.

The purpose of the trenches 82 filled with sacrificial material is to provide a better thermal isolation of the thermocouple 34 without increasing the topography of the surface, as it could adversely affect the photolithographic resolution. This step is straightforward in a Si based technology, where planarization is widely used. However, it might be more difficult or impossible to implement it in other technologies. In the latter case it can be omitted at the expense of a reduced (about 20%) output power.

Figure 29F:
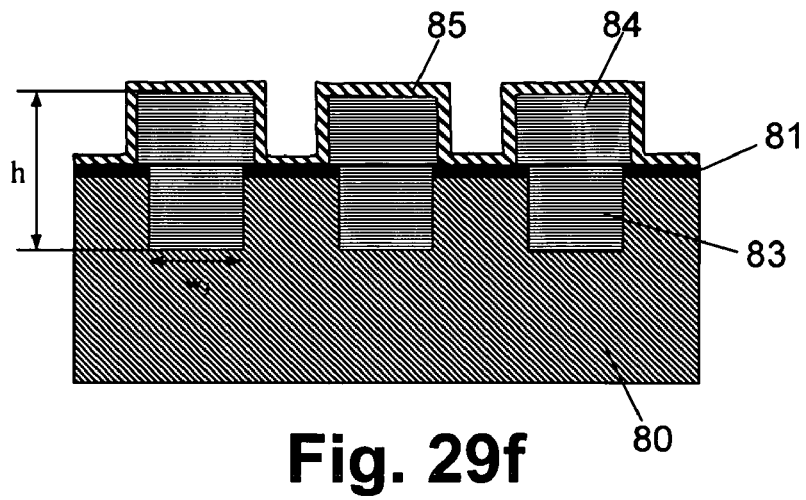
Figure 29G:
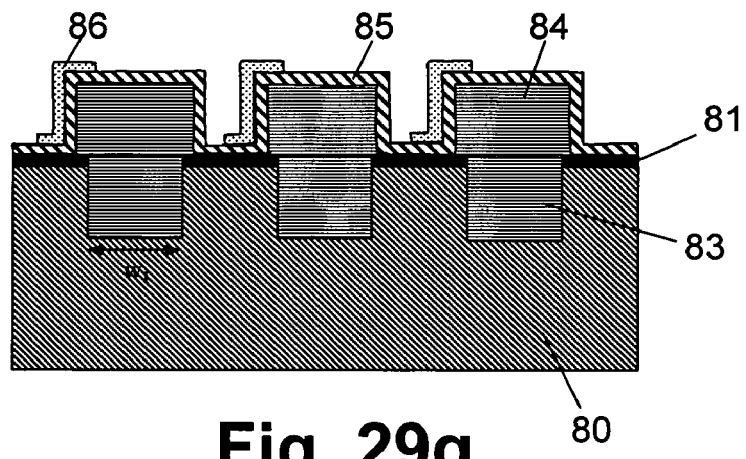
Figure 29H:
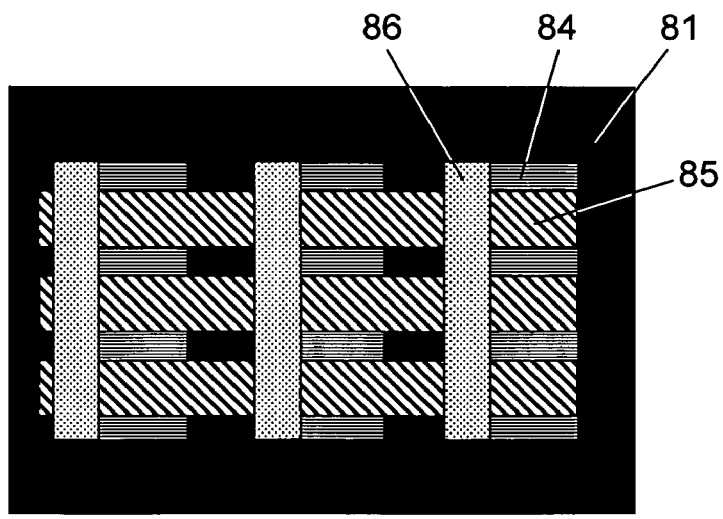

A thin film of a first thermoelectric material 85 is deposited as shown in FIG. 29f. In the example given, the material can be n-type or p-type SiGe and may be deposited by CVD or by any other suitable deposition technique. A thin insulating layer 86 is then deposited and patterned as shown in FIG. 29g. For example, the insulating layer 86 may be $SiO_2$ and may have a thickness of 0.5 μm. The thin film of the first thermoelectric material 85 is then patterned using lithographic methods. FIG. 29h shows the result after patterning of the thin layer of the first thermoelectric material 85.

Figure 29I:
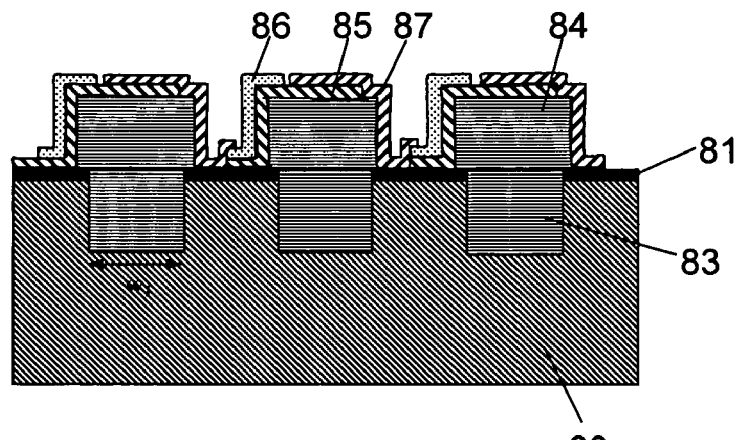
Figure 29J:
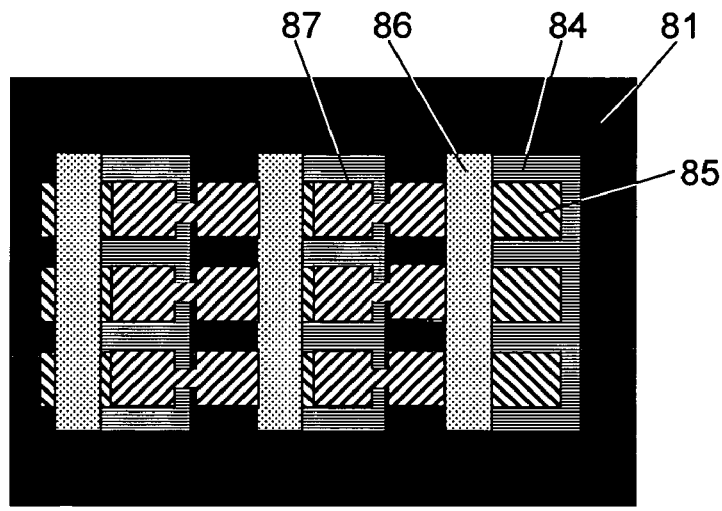

Then, a thin film of a second thermoelectric material 87 is deposited and patterned as shown in FIG. 29i (cross section) and in FIG. 29j (top view). The second thermoelectric material may be p-type or n-type SiGe deposited by CVD or by any other suitable deposition technique. The second thermoelectric material 87 has a dopant type (n-type or p-type) that is opposite to the dopant type of the first thermoelectric material 85. For example, if the first thermoelectric material 85 is n-SiGe, then the second thermoelectric material 87 is p-SiGe.

Figure 29K:
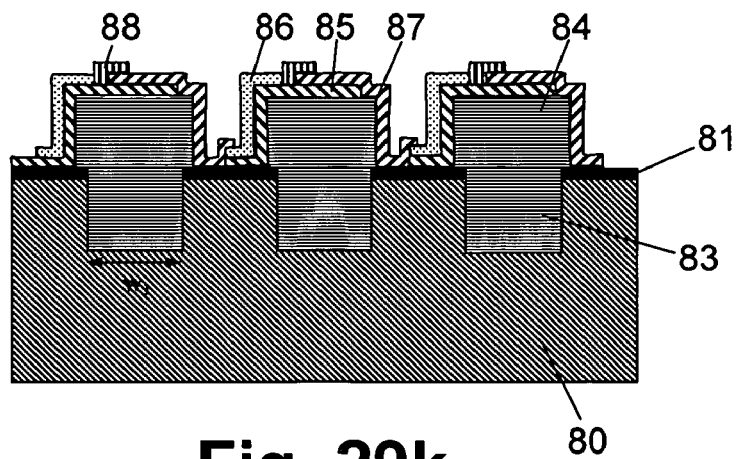
Figure 29L:
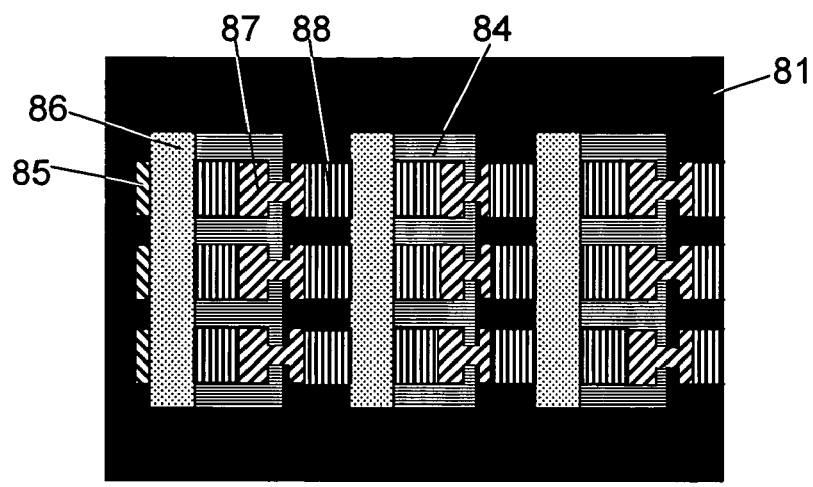

Then, a thin film of interconnection material 88, such as metal, is deposited and patterned as shown in FIG. 29k (cross section) and 29l (top view). The thin film of metal 88 may be composed of aluminium or any other suitable metal.

Secondly, the process for the manufacturing BiTe thermopiles 31 is described and is illustrated in FIGS. 30a to 30j. BiTe may be deposited by sputtering or electroplating. If sputtering is chosen, the process may proceed as described above for SiGe thermopiles 31, except for the fact that a suitable sacrificial material that can be etched selectively with respect to BiTe is used. In the case of BiTe thermopiles 31, the material used for the sacrificial layer may be any suitable material which can be etched away by an etching compound that does not etch the BiTe material of the thermopiles 31.

If plating is chosen as deposition method, one possibility may be to use the procedure as described by Jeffrey et al. in 'Thermoelectric micro-devices fabricated by a MEMS-like electrochemical process'; Nature Materials, 2, p. 528-531, August 2003.' However, in that process, the contact area and the cross section of the legs 35, 36 of the thermocouple 34 are identical. Hence, a contact area of the same cross section of the legs is produced. It is, however, preferable to have very small leg cross-sections and low contact resistance. The procedure described by Jeffrey et al. results in a contact resistance that may be too large for the desired dimensions. Therefore, the following process sequence, which is illustrated in FIG. 30a to FIG. 30j, is preferred.

Figure 30A:
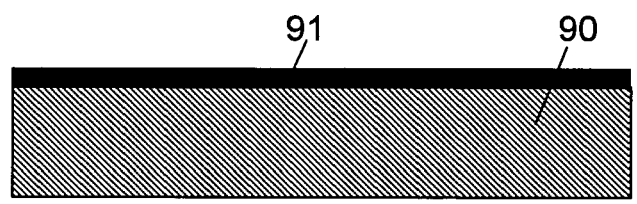
FIG. 30a to FIG. 30j illustrate of a fabrication process for BiTe thermopiles, according to an example.
Figure 30B:
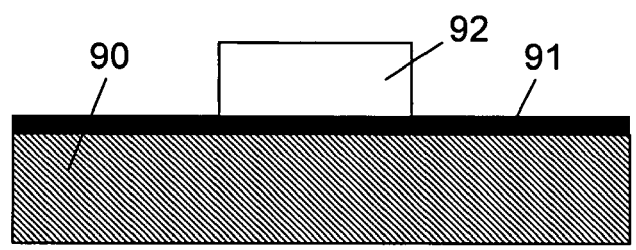
Figure 30C:
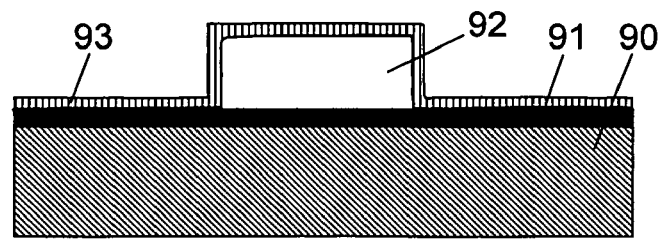

On a thermally conductive substrate 90, an electrically insulating layer 91 is deposited as illustrated in FIG. 30a. The thermally conducting substrate 90 may be any suitable substrate and may for example be AlN, Si, or others. The electrically insulating layer 91 may have any suitable thickness depending on the kind of electrically insulating material used and the quality thereof. Furthermore, the thickness is preferably chosen such that the material 81 has a compact structure without pin holes, which could produce short circuits. A sacrificial resist 92 is then deposited and patterned as illustrated in FIG. 30b. Next, a thin metal film 93 is deposited (see FIG. 30c). The thin metal film 93 acts as a seed layer for plating. For example, the thin metal film 93 may be Cr and may have a thickness of 5 to 20 nm.

Figure 30D:
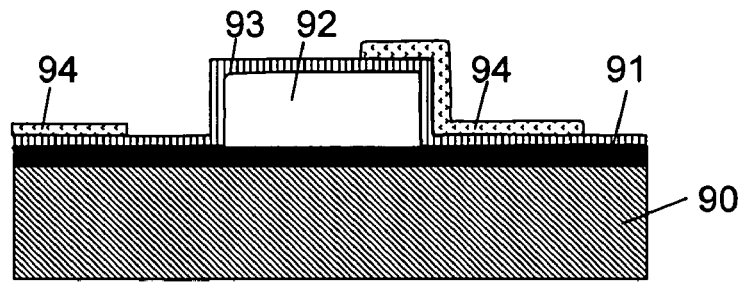
Figure 30E:
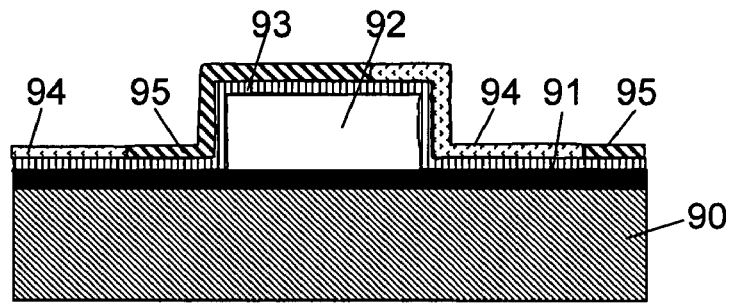
Figure 30F:
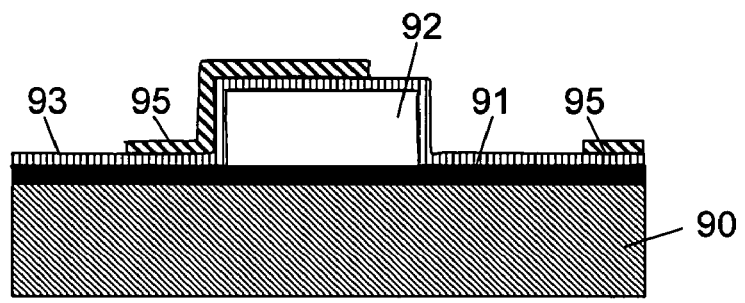

Next, a first plating resist 94 is deposited (e.g., spinned) in order to define a first plating area (see FIG. 30d). If required for enhancing the electrochemical reactions or for decreasing the contact resistance, a thin film of a metal different from Cr may also be used, such as Au. A first thermoelectric material 95 is then plated at those positions that are not covered by first plating resist 94 (see FIG. 30e). The first thermoelectric material 95 may be n-type or p-type BiTe or a similar material, such as SbTe or SbBiTe.

Figure 30G:
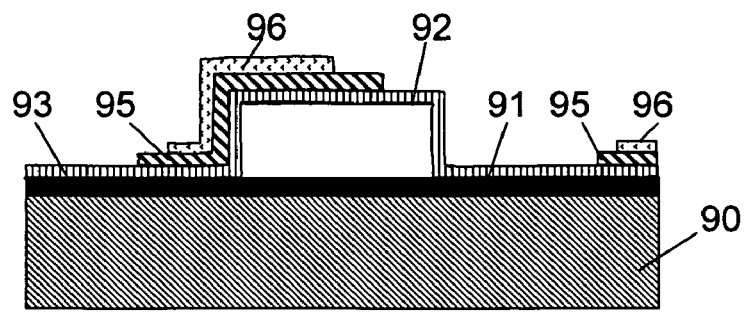
Figure 30H:
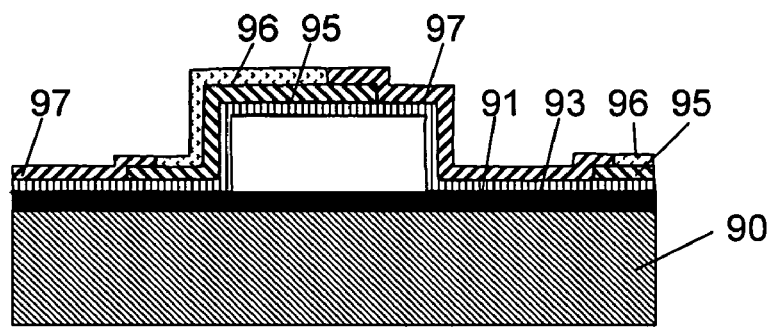
Figure 30I:
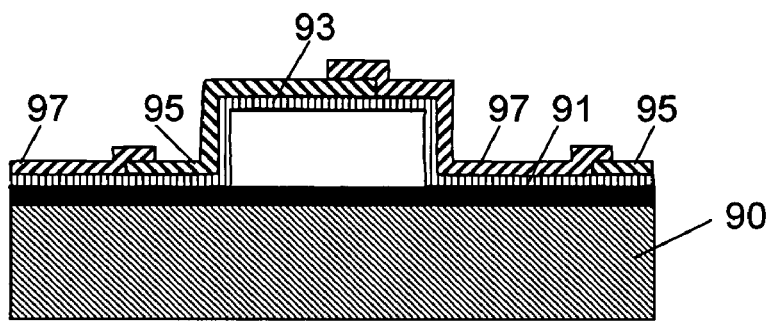
Figure 30J:
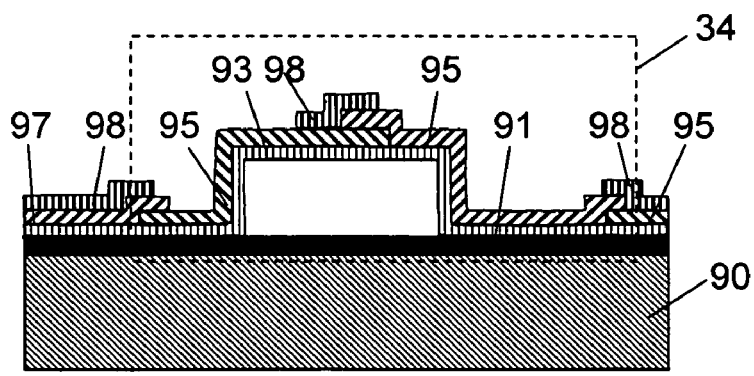

The first plating resist 94 is then removed (FIG. 30f) and a second plating resist 96 is deposited (e.g., spinned) and patterned in order to define a second plating area (FIG. 30g). A second thermoelectric material 97 is plated as shown in FIG. 30h at locations not covered by the second plating resist 96. This material can be p-type or n-type BiTe, taken into account that the doping type should be opposite to the doping type of the first thermoelectric material. The second plating resist 96 is then removed (FIG. 30i) by suitable techniques. Next, a thin film of interconnection material 98, such as metal, is deposited and patterned as shown in FIG. 30j. This metal may be Al or any other suitable metal.

The rim 45 is then fabricated. A thin protective film is deposited onto the substrate 80, 90 comprising the thermopiles 31 as illustrated in cross-section in FIG. 30j. It may be convenient, but is not necessary, to use the same material as the material that has been used for the two sacrificial layers in case of constructing the SiGe thermopiles, such as $SiO_2$. The thin protective film is then patterned in such a way that it protects the fabricated thermopiles 31. The unprotected area is etched away for a depth of a few hundred micrometers. If silicon was used as a substrate 80, 90, the rim 45 may be fabricated by deep reactive ion etching (DRIE). Other etching techniques may also be possible for silicon, as well as for other types of substrates 80, 90. A part of the chip surface could be etched through as well if the remaining area of its surface contacting the hot plate 37 or the cold plate 38 is large enough to ensure low thermal resistance of the substrate-plate interface.

Figure 31:
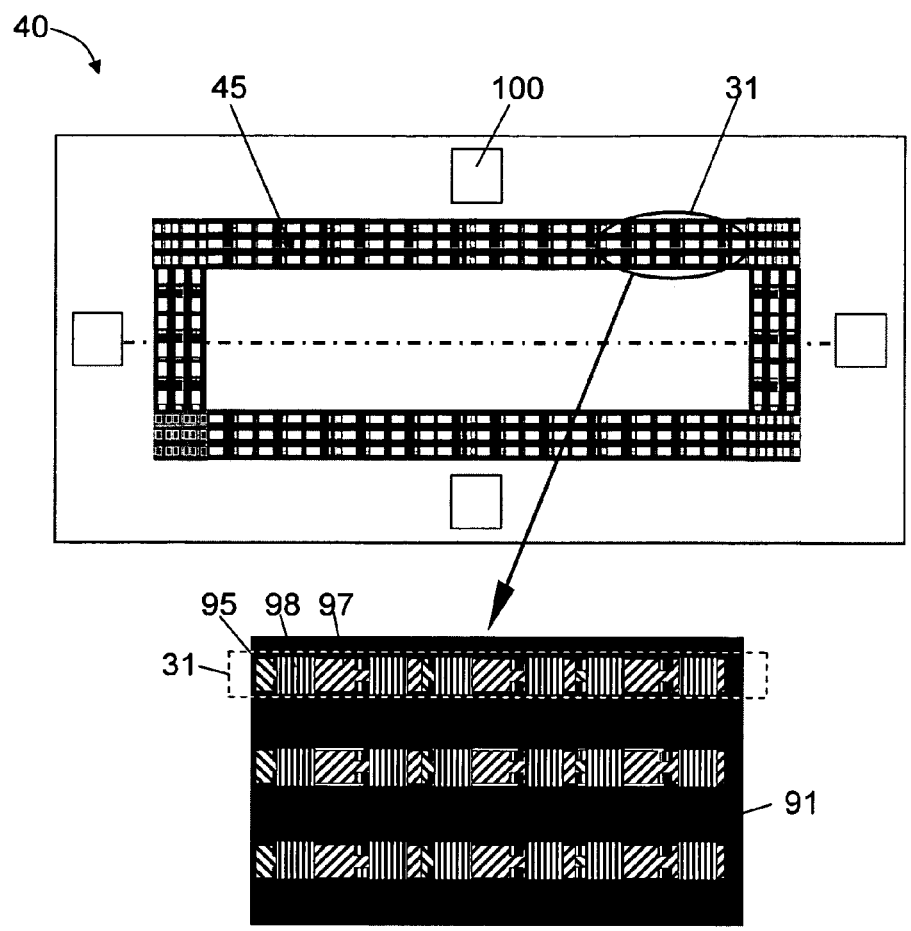
FIG. 31 is a top view of a TEG mounted on a top plate, according to an example.
Figure 32:
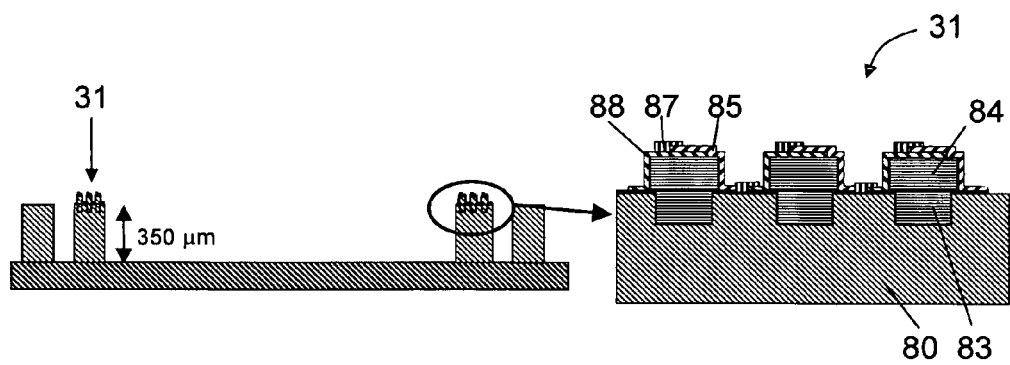
FIG. 32 is a cross-sectional view of the TEG depicted in FIG. 31, according to an example.

Together with the raised elongate structure or rim 45, several supports 100 could also be fabricated. For example, four supports 100 may be fabricated. After that, the protective layer may then be removed and the sacrificial layer underneath the thermopiles 31 may be dissolved in any suitable solvent. In the case of plated thermoelectric material, the seed layer 93 should be removed by means of a suitable etching technique at those places where it is exposed to the etching compound to avoid short circuit. An illustration of the TEG 40 at this stage in the fabrication process is illustrated in FIG. 31 (top view) and FIG. 32 (side view). These figures show the TEG 40 before the top or cold plate 38 is mounted.

The cold plate 38 is then mounted. The design of photolithographic masks for thermopile fabrication is done in such a way that some thermocouples 34 are not released (i.e., the sacrificial layer remains under the thermocouple 34). These thermocouples 34 that are not released may form a series of robust 'stoppers,' whose purpose is to avoid either mechanical stress on the fragile active thermocouples 34, or the destruction of the thermocouples 34 during the bonding of the cold plate 38.

The cold plate 38, or a heat-spreading chip, can be made with a plain silicon wafer or by any other material with good thermal conductivity. The cold plate 38 can also be shaped in appropriate ways to enhance thermal efficiency. Fabrication and mounting of the cold plate 38 are illustrated in FIGS. 33 and 34.

Figure 33:
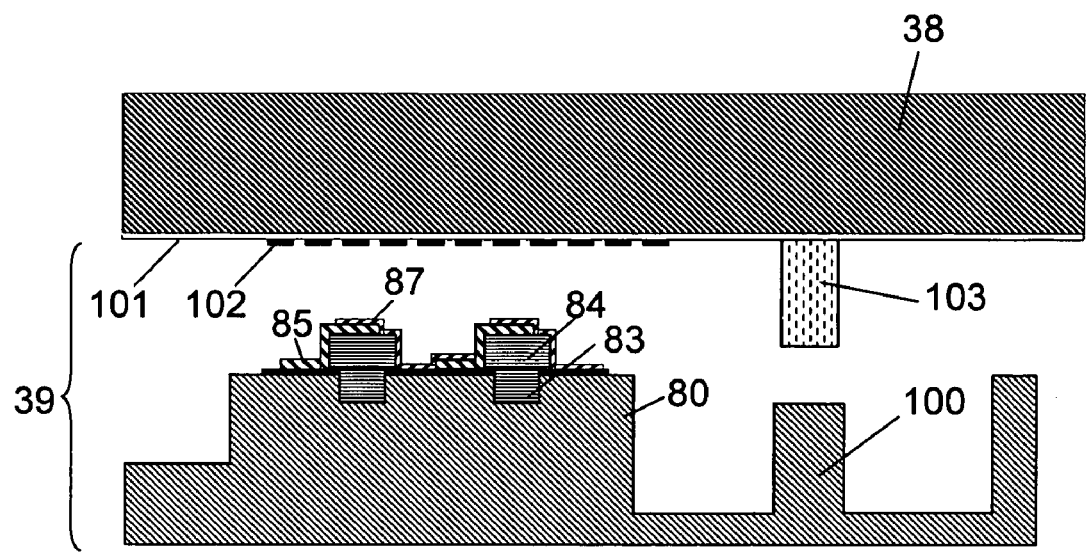
FIG. 33 and FIG. 34 illustrate the mounting of the top plate on top of a thermopile chip, according to an example.
Figure 34:
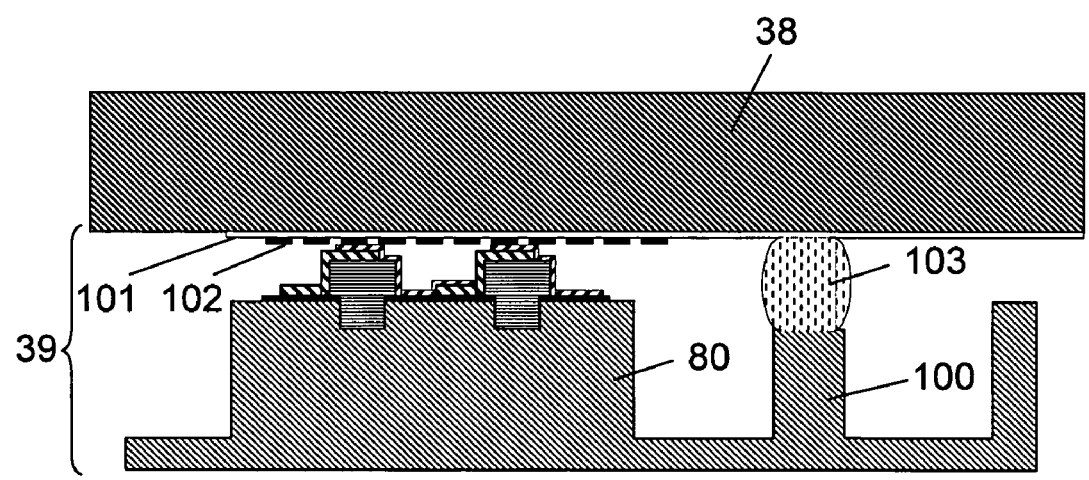

In FIG. 33, the cold plate 38 is not yet in contact with the thermopile chip 39, while in FIG. 34 the cold plate 38 is mounted on the thermopile chip 39. An electrically isolating layer 101 is deposited on the substrate. The substrate will later form the cold plate 38. An indium layer is then deposited on the side of the substrate that comes into contact with the thermocouples 34. Besides indium, any other suitable low temperature melting alloy may be used here.

A two-dimensional pattern 102 (e.g., small squares) is manufactured from the indium layer, for example by photolithography. Pattern dimensions must be small enough to avoid electrical short circuit between neighboring thermocouples 34, but large enough to provide a good thermal contact with the top aluminum layer of the thermopile chip 39. Next, a benzocyclobutylene (BCB) 103 is spinned onto the cold plate 38 and patterned in correspondence with the supports 100 on the thermopile chip 39 in order to form an adhesive layer.

The cold plate 38 is then flip-chip bonded to the thermopile chip 39 using the BCB 103 as an adhesive. Curing of the BCB 103 is performed at a temperature sufficient to reflow indium, such as approximately 150° C. In this way, a good thermal contact with the metal contacts 88, 98 is obtained (see FIG. 34). The metal contacts are preferably aluminium, but may be composed of any other suitable material. A heat-sink or heat-spreading chip 46 (not shown in FIG. 34) may also be provided in between the cold plate 37 and the thermopile 31. Furthermore, at least one spacer 41 is provided in between the thermopile 31 and at least one of the hot plate 37 or the cold plate 38.

The method of manufacturing the TEG 40 as described above is provided as a non-limiting example. Other materials and fabrication techniques may also be used. The rim 45 may also be positioned in between the hot plate 37 and the thermopile 31, while the heat-sink or heat-spreading chip 46 may be positioned in between the cold plate 38 and the thermopile 31.

It should be understood that the illustrated embodiments are examples only and should not be taken as limiting the scope of the present invention. For example, other thermoelectric materials may be used besides BiTe or SiGe. The claims should not be read as limited to the described order or elements unless stated to that effect. Therefore, all embodiments that come within the scope and spirit of the following claims and equivalents thereto are claimed as the invention.

We claim:

1. A thermoelectric generator, comprising in combination:
at least one thermopile positioned in between a first plate and a second plate, each thermopile comprising a plurality of thermocouples, each thermocouple having two legs defining a height and a footprint with a base area;
at least one spacer separating the at least one thermopile from at least one of the first plate or the second plate, wherein the height of at least one spacer is at least ten times larger than the height of the thermocouple legs;
a raised elongate structure between the at least one spacer and the at least one thermopile,
wherein the plurality of thermocouples are distributed on the raised elongate structure over an area of one of the first plate or the second plate, and
wherein the area of the one of the first plate or the second plate is substantially larger than a total base area of the plurality of thermocouples.

2. A thermoelectric generator according claim 1, wherein the raised elongate structure defines a rim having a surface area that is substantially the same as the total base area of the plurality of thermocouples.

3. A thermoelectric generator according to claim 1, further comprising a heat-spreading chip located in between the thermopile and one of the first plate or the second plate.

4. A thermoelectric generator according to claim 1, wherein one of the first plate or second plate is a cold plate, and wherein the thermoelectric generator includes at least one of the at least one spacers in between the at least one thermopile and the cold plate.

5. A thermoelectric generator according to claim 1, wherein the second plate is a cold plate, and wherein the thermoelectric generator further includes a radiator mounted on the cold plate.

6. A thermoelectric generator according claim 1, wherein the first plate has a first size and the second plate has a second size, and wherein the first size is different than the second size.

7. A thermoelectric generator according to claim 6, wherein the first size is smaller than the second size.

8. A thermoelectric generator according to claim 1, further comprising a shock-protecting structure.

9. A thermoelectric generator according to claim 8, wherein the shock-protecting structure includes a thermally isolating plate and pillars, wherein the pillars connect the thermally isolating plate to the second plate.

10. A thermoelectric generator according to claim 9, wherein the thermally isolating plate includes a hole in which the at least one spacer is positioned.

11. A thermoelectric generator according to claim 1, further comprising a touch-protecting structure.

12. A thermoelectric generator according to claim 1, further comprising a thermal screen positioned in between and thermally isolated from both the first plate and the second plate.

13. A thermoelectric generator according to claim 1, wherein the thermoelectric generator is attached to a watchstrap.

14. A thermoelectric generator according to claim 1, wherein the thermoelectric generator is mounted on a clamp for attaching to a piece of clothing such that one of the first plate or the second plate is in contact with skin of a human being.

15. A thermoelectric generator according to claim 14, wherein the clamp includes heat isolating pads positioned on a radiator for providing direct contact of the radiator to the piece of clothing.

16. A thermoelectric generator according to claim 1, wherein the plurality of thermocouples is composed of SiGe or BiTe.

* * * * *